US010825493B2

(12) United States Patent
Karim

(10) Patent No.: US 10,825,493 B2
(45) Date of Patent: Nov. 3, 2020

(54) FEEDBACK FOR MULTI-LEVEL SIGNALING IN A MEMORY DEVICE

(71) Applicant: Micron Technology, Inc., Boise, ID (US)

(72) Inventor: M Ataul Karim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/220,755

(22) Filed: Dec. 14, 2018

(65) Prior Publication Data

US 2020/0194043 A1 Jun. 18, 2020

(51) Int. Cl.
*G11C 7/10* (2006.01)
*G11C 7/22* (2006.01)
(Continued)

(52) U.S. Cl.
CPC ............. *G11C 7/222* (2013.01); *G11C 7/04* (2013.01); *G11C 7/106* (2013.01); *G11C 7/1039* (2013.01);
(Continued)

(58) Field of Classification Search
CPC .......... G11C 7/222; G11C 7/22; G11C 5/147; G11C 13/0069; G11C 29/028; G11C 29/023; G11C 11/4076; G11C 7/062; G11C 7/1078; G11C 16/10; G11C 7/067; G11C 8/08; G11C 7/1084; G11C 11/1653; G11C 11/1675; G11C 7/225; G11C 7/14; G11C 8/12
See application file for complete search history.

(56) References Cited

U.S. PATENT DOCUMENTS 9,711,206 B2 * 7/2017 Hush ................... G11C 11/4091
2006/0285395 A1 12/2006 Booth et al.
(Continued)

FOREIGN PATENT DOCUMENTS

KR 101165547 B1 7/2012
WO 2017127222 7/2017

OTHER PUBLICATIONS

ISA/KR International Search Report and Written Opinion of the International Searching Authority, Int'l. Appl. No. PCT/US2019/063098, dated Mar. 13, 2020, Seo-gu, Daejeon, Republic of Korea, 11 pgs.

*Primary Examiner* — Hien N Nguyen
(74) *Attorney, Agent, or Firm* — Holland & Hart LLP

(57) ABSTRACT

Methods, systems, and devices for feedback for multi-level signaling in a memory device are described. The memory device may use pulse amplitude modulation (PAM) signaling (e.g., PAM4) that is synchronized with a clock signal using a double data rate (DDR) to communicate information with a host device. The memory device may include a first circuit for determining voltage levels of sampling events associated with a rising edge of the clock signal and a second circuit for determining voltage levels of sampling events associated with a falling edge of the clock signal. A feedback circuit may receive a feedback signal associated with the first circuit and modify the signal input into the second circuit. The feedback circuit may include a latch circuit configured to receive portions of the signal and receive a first control signal and a second control signal to tune portions of the signal.

34 Claims, 11 Drawing Sheets

(51) Int. Cl.
*G11C 11/4099* (2006.01)
*G11C 7/04* (2006.01)
*G11C 11/4076* (2006.01)

(52) U.S. Cl.
CPC .......... *G11C 7/1063* (2013.01); *G11C 7/1066* (2013.01); *G11C 7/1087* (2013.01); *G11C 7/1093* (2013.01); *G11C 11/4076* (2013.01); *G11C 11/4099* (2013.01)

(56) References Cited

U.S. PATENT DOCUMENTS

| | | |
|---|---|---|
| 2012/0230381 A1 | 9/2012 | Jang |
| 2017/0039950 A1 | 2/2017 | Li et al. |
| 2017/0085403 A1* | 3/2017 | Sun .................. H04L 27/01 |
| 2017/0316816 A1* | 11/2017 | Hush .................. G11C 11/4091 |
| 2017/0322588 A1 | 11/2017 | Lillestolen et al. |
| 2019/0103148 A1* | 4/2019 | Hasbun ................ G11C 7/1066 |
| 2019/0229716 A1* | 7/2019 | Zillman .............. H03M 1/1225 |
| 2019/0277891 A1* | 9/2019 | Peng .................. G01R 19/0038 |

* cited by examiner

FEEDBACK FOR MULTI-LEVEL SIGNALING IN A MEMORY DEVICE

BACKGROUND

The following relates generally to a system that includes at least one memory device and more specifically to feedback for multi-level signaling in a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source.

Some signals communicated with a memory device may experience inter-symbol interference (ISI). In some examples, ISI may degrade the integrity of the signals, thereby increasing the difficulty of detecting data encoded in the signals.

DETAILED DESCRIPTION

Some memory devices may utilize a four-level pulse amplitude modulation (PAM4) scheme based decision feedback equalization (DFE) in a memory device to reduce inter-symbol interference (ISI) in signals communicated with a host device, thereby increasing the integrity and detection of the signals. In some cases, the signal may be an example of a multi-level signal (e.g., a signal modulated using a modulation scheme that includes three or more symbols such as the PAM4 scheme). In such cases, reducing ISI may reduce the oscillations in a pulse response and increase the bandwidth associated with the memory channel. The feedback circuit may be implemented for both single-ended signaling and differential signaling.

Some memory devices may utilize a double data rate (DDR) timing scheme along with a multi-level modulation scheme. To decode signals modulated using a multi-level modulation scheme and clocked using a DDR timing scheme, a memory device may include plurality of receivers to process portions of an incoming signal in parallel. For example, a memory device may include a first receiving circuit to identify symbols that are received during a sampling event that is associated with a rising edge of a clock signal and a second receiving circuit to identify symbols that are received during a sampling event that is associated with a falling edge of the clock signal. The memory device may also include a feedback circuit configured to facilitate feedback in receivers that are configured to decode signals that are modulated using a multi-level modulation scheme and are clocked using a DDR timing scheme.

In some cases, latch circuits of a receiver may compare voltage levels of the differential signal to reference voltages. To facilitate use with a signal that has been modulated with a multi-level modulation scheme, a latch circuit may include separate portions that are tunable for different reference voltages. For example, the latch circuit may include a first switching component configured to receive a first portion of the differential signal and a third switching component configured to receive a second portion of the differential signal. The latch circuit may also include a second switching component configured to receive a first control signal that tunes first portion of the differential signal and a fourth switching component configured to receive a second control signal that tunes the second portion of the differential signal.

Figure 1:
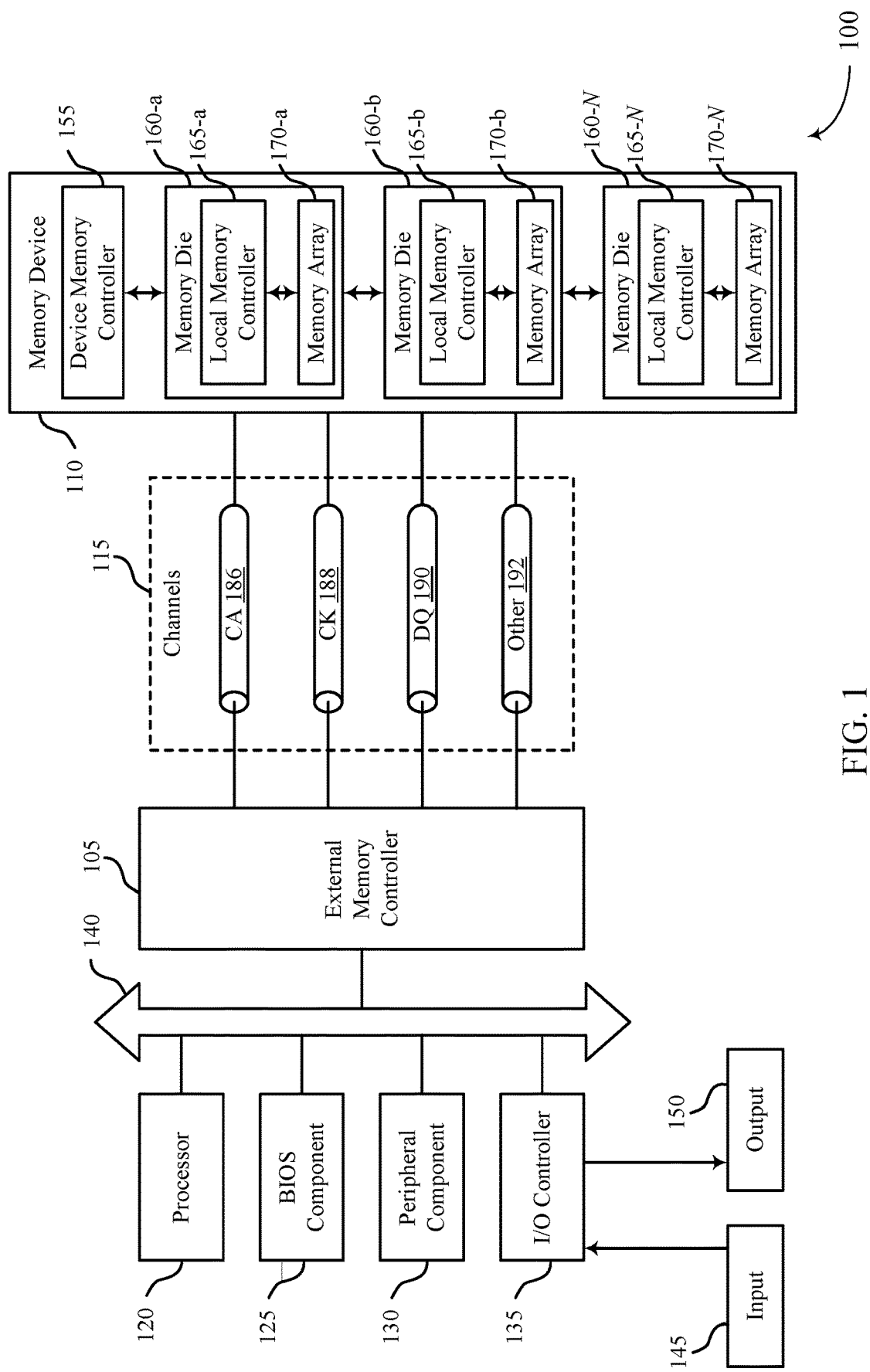
FIG. 1 illustrates an example of a system that supports feedback for multi-level signaling in a memory device in accordance with examples as disclosed herein.
Figure 2:
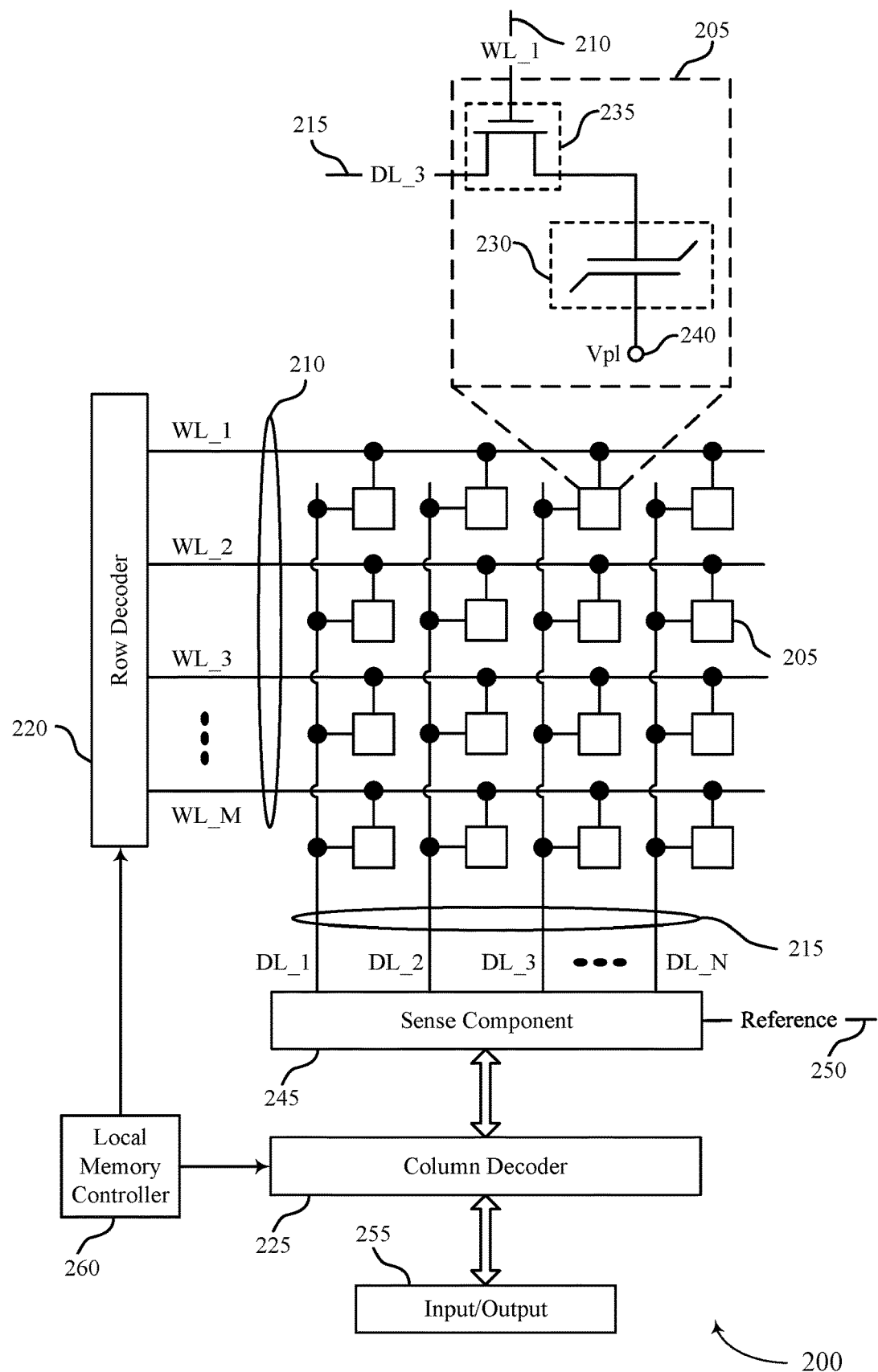
FIG. 2 illustrates an example of a memory die that supports feedback for multi-level signaling in a memory device in accordance with examples as disclosed herein.

Features of the disclosure are initially described in the context of a memory system in FIGS. 1 and 2. Features of the disclosure are described in the context of a circuit in FIGS. 3 through 8. These and other features of the disclosure are further illustrated by and described with reference to FIGS. 9 through 11, which include an apparatus diagram and flowcharts that relate to feedback for multi-level signaling in a memory device.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card. In some cases, the host device may communicate one or more single-ended signals over a channel with the memory device 110.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package). In some cases, the memory device 110 may output a single-ended signal over a channel to the circuit.

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a DDR timing scheme. For example, some symbols of a signal may be registered on a rising edge of a clock signal and other symbols of the signal may be registered on a falling edge of the clock signal.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., non-return-to-zero (NRZ), PAM4).

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, NRZ, unipolar encoding, bipolar encoding, Manchester encoding, PAM having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some cases, a PAM4 modulation scheme may increase the rate of data transfer in channels. In some cases, implementing a PAM4 modulation scheme may be an alternative to using an NRZ modulation scheme. PAM4 signaling, however, may include some inter-symbol interference. A receiver may be configured to account for inter-symbol interference. Such interference mitigation operations may be complicated when the signaling using a DDR timing scheme. In such examples, the receiver may include a first circuit may determine a first voltage level of a signal modulated using a modulation scheme that includes three or more voltage levels (e.g., PAM4). A second circuit of the receiver may determine a second voltage level of the signal modulated using the modulation scheme that includes three or more voltage levels (e.g., PAM4).

FIG. 2 illustrates an example of a memory die 200 in accordance with various examples of the present disclosure. The memory die 200 may be an example of the memory dice 160 described with reference to FIG. 1. In some cases, memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

The memory die 200 may be configured to store data received from a host device using signaling that is modulated using a multi-level modulation scheme and clocked using a DDR timing scheme. In such situations, the memory device may be configured to mitigate inter-symbol interference using a feedback circuit.

Figure 3:
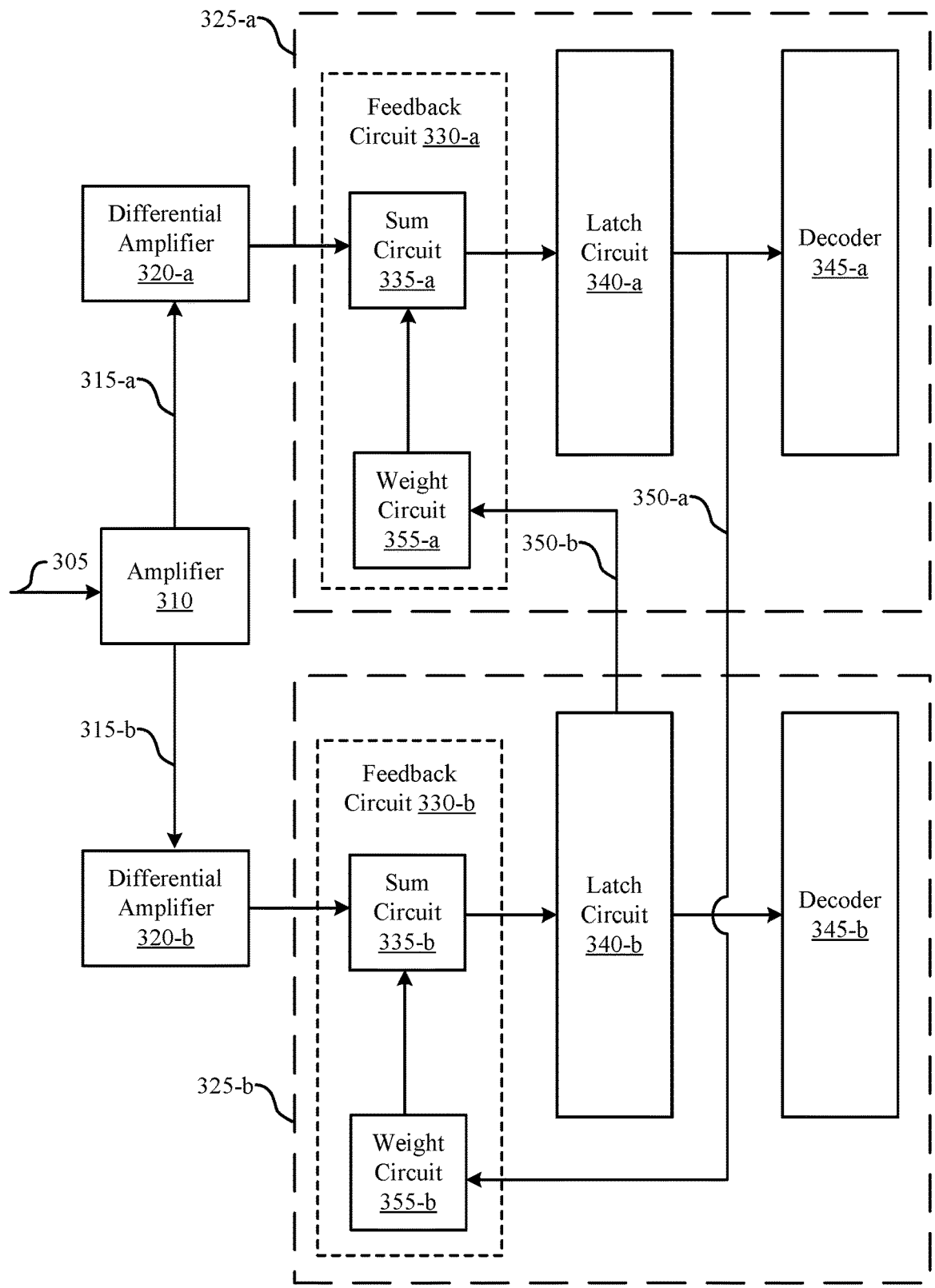
FIG. 3 illustrates an example of a circuit that supports feedback for multi-level signaling in a memory device in accordance with examples as disclosed herein.

FIG. 3 illustrates an example of a circuit 300 that supports feedback for multi-level signaling in a memory device in accordance with examples as disclosed herein. The circuit 300 may represent at least a portion of the memory devices 110 and 200 described with reference to FIGS. 1 and 2. Circuit 300 may include amplifier 310, differential amplifier 320-a, differential amplifier 320-b, first circuit 325-a, and second circuit 325-*b*. First circuit 325-*a* may include feedback circuit 330-*a*, latch circuit 340-*a*, and decoder 345-*a*. Second circuit 325-*b* may comprise feedback circuit 330-*b*, latch circuit 340-*b*, and decoder 345-*b*. Circuit 300 is an example of a circuit that may modify the signal by a feedback circuit, as described with reference to FIGS. 1 and 2, among other aspects of the present disclosure.

In some examples, circuit 300 may support signaling that uses a DDR timing scheme and a multi-level modulation scheme (e.g., PAM4). In such cases, circuit 300 may include first circuit 325-*a* and second circuit 325-*b* parallel to the first circuit for decoding a signal received over a channel. In some cases, first circuit 325-*a* and second circuit 325-*b* may each include equalization blocks. For example, the equalization blocks may include Continuous Time Linear Equalization (CTLE), Receiver Feed Forward Equalization (Rx-FFE), or DFE. In some examples, DFE may be used for reflection and crosstalk dominated channels (e.g., memory channels).

Amplifier 310 may be configured to receive a signal 305 over a channel coupled with a host device or a memory device. In some examples, signal 305 may be a single-ended signal. Amplifier 310 may be configured to output a differential signal based on receiving a single-ended signal. Amplifier 310 may generate and output the signal 315-*a* to differential amplifier 320-*a* and the signal 315-*b* to differential amplifier 320-*b*. Signal 315-*a* and signal 315-*b* may each be examples of a differential signal. In some cases, the signal 315-*a* and the signal 315-*b* may be the same signal. In some cases, signal 315-*a* and 315-*b* may each be modulated using a multi-level modulation scheme (e.g., PAM4) and may include ISI after being communicated over the channel. In some examples, a linear driver may generate the differential PAM4 signal.

Amplifier 310 may be coupled with differential amplifier 320-*a*. In some case, differential amplifier 320-*a* may be coupled with feedback circuit 330-*a*. Feedback circuit 330-*a* may include sum circuit 335-*a* and weight circuit 355-*a*. In such cases, sum circuit 335-*a* may be coupled with differential amplifier 320-*a*. Feedback circuit 330-*a* may be coupled with latch circuit 340-*a*. For example, sum circuit 335-*a* may be coupled with latch circuit 340-*a*. Latch circuit 340-*a* may include a strongARM latch (e.g., a strong arm based differential slicer). In some examples, latch circuit 340-*a* may be coupled with decoder 345-*a*. Decoder 345-*a* may be an example of, but is not limited to, a thermometer code decoder.

In other examples, amplifier 310 may be coupled with differential amplifier 320-*b*. In some case, differential amplifier 320-*b* may be coupled with feedback circuit 330-*b*. Feedback circuit 330-*b* may include sum circuit 335-*b* and weight circuit 355-*b*. In such cases, sum circuit 335-*b* may be coupled with differential amplifier 320-*b*. Feedback circuit 330-*b* may be coupled with latch circuit 340-*b*. For example, sum circuit 335-*b* may be coupled with latch circuit 340-*b*. Latch circuit 340-*b* may include a strongARM latch (e.g., a strong arm based differential slicer). In some examples, latch circuit 340-*b* may be coupled with decoder 345-*b*. Decoder 345-*b* may be an example of, but is not limited to, a thermometer code decoder.

In some cases, signal 315-*a* and 315-*b* may modulated using a modulation scheme that includes four symbols, where each symbol may be represented by a voltage level. For example, the multi-level modulation scheme may include signal level L0, L1, L2, and L3. In some examples, signal 315-*a* and 315-*b* may be one or more differential signals. The differential signals may include a true signal (e.g., P signal) and a complement signal (e.g., N signal). In some examples, the P signal may be at signal level L3, and the corresponding N signal may be at signal level L0. In other examples, the P signal may be at signal level L2, and the corresponding N signal may be at signal level L1. In some cases, the P signal may be at signal level L1, and the corresponding N signal may be at signal level L2. In some cases, signal 315-*a* and 315-*b* may be an example of a 12 Gbps DDR PAM4 signal.

In some cases, differential amplifier 320-*a* may be coupled with the input of the first circuit 325-*a*. For example, differential amplifier 320-*a* may receive signal 315-*a*. First circuit 325-*a* may be configured to determine the symbol or voltage level of the signal 315-*a* at a particular sampling event. In some cases, first circuit 325-*a* may determine the first voltage level of the signal for a first sampling event associated with a rising edge of a clock signal.

Sum circuit 335-*a* may receive the signal from differential amplifier 320-*a* and output the signal to latch circuit 340-*a*. Sum circuit 335-*a* may be an example of a summing node configured to sum a main signal (e.g., signal 315-*a*) and a feedback signal (e.g., signal 350-*b*). Latch circuit 340-*a* may compare the signal to one or more different reference voltages. For example, latch circuit 340-*a* may include one or more latch circuits where each latch circuit compares the signal to a different reference voltage. The quantity of latch circuits in the latch circuit 340-*a* may be based on the number of symbols included in the modulation scheme. For example, for a PAM4 scheme, the latch circuit 340-*a* may include three latch circuits to distinguish all of the different levels that may be present in a signal. As described herein in further detail, the latch circuit 340-*a* may generate feedback signal 350-*a* based on comparing the signal to a reference voltage. Feedback signal 350-*a* may be an example of a differential signal.

The feedback signal 350-*a* may comprise the output of the latch circuit 340-*a*. In some examples, the feedback signal 350-*a* may include one or more different signals. Each signal may output for a specific latch circuit of the latch circuit 340-*a*. In some cases, each signal in the feedback signal may be an example of a differential signal that is modulated using a two-level modulation scheme. In some cases, a selective biasing technique may be used to slice the P signal and the N signal at two different voltage levels. For example, a single latch may be configured to compare the P signal to a first reference voltage and compare the N signal to a different reference voltage. In some cases, decoder 345-*a* may receive feedback signal 350-*a* from latch circuit 340-*a*. For example, decoder 345-*a* may determine a symbol associated with the signal based on the feedback signal 350-*a*.

In some cases, differential amplifier 320-*b* may be coupled with the input of the second circuit 325-*b*. For example, differential amplifier 320-*b* may receive signal 315-*b*. Second circuit 325-*b* may be configured to determine symbol or voltage level of the signal 315-*b* at a particular sampling event. In some cases, second circuit 325-*b* may determine the second voltage level of the signal for a second sampling event associated with a falling edge of the clock signal.

Sum circuit 335-*b* may receive the signal from differential amplifier 320-*b* and output the signal to latch circuit 340-*b*. Sum circuit 335-*b* may be an example of a summing node configured to sum a main signal (e.g., signal 315-*b*) and a feedback signal (e.g., signal 350-*a*). Latch circuit 340-*b* may compare the signal to one or more different reference voltages. For example, latch circuit 340-*b* may include one or more latch circuits where each latch circuit compares the signal to a different reference voltage. The quantity of latch circuits in the latch circuit 340-*b* may be based on the number of symbols included in the modulation scheme. For example, for a PAM4 scheme, the latch circuit 340-*b* may include three latch circuits to distinguish all of the different levels that may be present in a signal. As described herein in further detail, the latch circuit 340-*b* may generate feedback signal 350-*b* based on comparing the signal to a reference voltage. Feedback signal 350-*b* may be an example of a differential signal.

The feedback signal 350-*b* may comprise the output of the latch circuit 340-*b*. In some examples, the feedback signal 350-*b* may include one or more different signals. Each signal may output for a specific latch circuit of the latch circuit 340-*b*. In some cases, each signal in the feedback signal may be an example of a differential signal that is modulated using a two-level modulation scheme. In some cases, a selective biasing technique may be used to slice the P signal and the N signal at two different voltage levels. For example, a single latch may be configured to compare the P signal to a first reference voltage and compare the N signal to a different reference voltage. In some cases, decoder 345-*b* may receive feedback signal 350-*b* from latch circuit 340-*b*. For example, decoder 345-*b* may determine a symbol associated with the signal based on the feedback signal 350-*b*.

Signals received by the circuit 300 may include some amount of inter-symbol interference. The feedback circuits 330-*a* and 330-*b* may be configured to reduce or correct for the inter-symbol interference and thereby improve the quality of the signal before it is latched and decoded. The feedback circuits 330-*a* and 330-*b* may be configured to take the outputs of a first sampling event and feed that information back to the first circuit 325-*a* or the second circuit 325-*b* to compensate for inter-symbol interference in the signal at a subsequent sampling event. In some examples, the voltage level of the signal determined by first circuit 325-*a* may be based on feedback circuit 330-*a* causing the signal to be modified based on the output of a preceding sampling event. For example, feedback circuit 330-*a* may be coupled with the output of second circuit 325-*b* (e.g., feedback signal 350-*b*) and the input of first circuit 325-*a* (e.g., signal 315-*a*). Feedback circuit 330-*a* may receive, from second circuit 325-*b* and/or the latch circuit 340-*b*, feedback signal 350-*b*. Feedback signal 350-*b* may indicate information about the voltage level of a preceding sampling event.

Feedback circuit 330-*a* may modify the signal 315-*a* input into first circuit 325-*a* based on feedback signal 350-*b*. In such cases, feedback circuit 330-*a* may equalize a multi-level signal. For example, feedback circuit 330-*a* may include weight circuit 355-*a*. Weight circuit 355-*a* may apply a different feedback signal to the signal. In some cases, weight circuit 355-*a* may include one or more tap circuits to weight the feedback signal 350-*b* according to a feedback parameter. In some examples, weight circuit 355-*a* may multiply the feedback signal 350-*b* by a tap weight. For example, weight circuit 355-*a* may be coupled with sum circuit 335-*a* and latch circuit 340-*b* (e.g., to receive feedback signal 350-*b*). In some cases, feedback circuit 330-*a* may include a delay circuit. The delay circuit may delay the feedback signal at least one sampling event. In some cases, the delay circuit may be coupled with weight circuit 355-*a*. Feedback circuit 330-*a* may also utilize a full rate clock architecture.

In some examples, the voltage level of the signal determined by second circuit 325-*b* may be based on feedback circuit 330-*b* causing the signal to be modified based on the output of a preceding sampling event. For example, feedback circuit 330-*b* may be coupled with the output of first circuit 325-*a* (e.g., feedback signal 350-*a*) and the input of second circuit 325-*b* (e.g., signal 315-*b*). Feedback circuit 330-*b* may receive, from first circuit 325-*a* and/or the latch circuit 340-*a*, feedback signal 350-*a*. Feedback signal 350-*a* may indicate information about the voltage level of a preceding sampling event.

Feedback circuit 330-*b* may modify the signal 315-*b* input into second circuit 325-*b* based on feedback signal 350-*a*. In such cases, feedback circuit 330-*b* may equalize a multi-level signal. For example, feedback circuit 330-*b* may include weight circuit 355-*b*. Weight circuit 355-*b* may apply a different feedback signal to the signal. In some cases, weight circuit 355-*b* may include one or more tap circuits to weight the feedback signal 350-*a* according to a feedback parameter. In some examples, weight circuit 355-*b* may multiply the feedback signal 350-*a* by a tap weight. For example, weight circuit 355-*b* may be coupled with sum circuit 335-*b* and latch circuit 340-*a* (e.g., to receive feedback signal 350-*a*). In some cases, feedback circuit 330-*b* may include a delay circuit. The delay circuit may delay the feedback signal at least one sampling event. In some cases, the delay circuit may be coupled with weight circuit 355-*b*. Feedback circuit 330-*b* may also utilize a full rate clock architecture.

Figure 4:
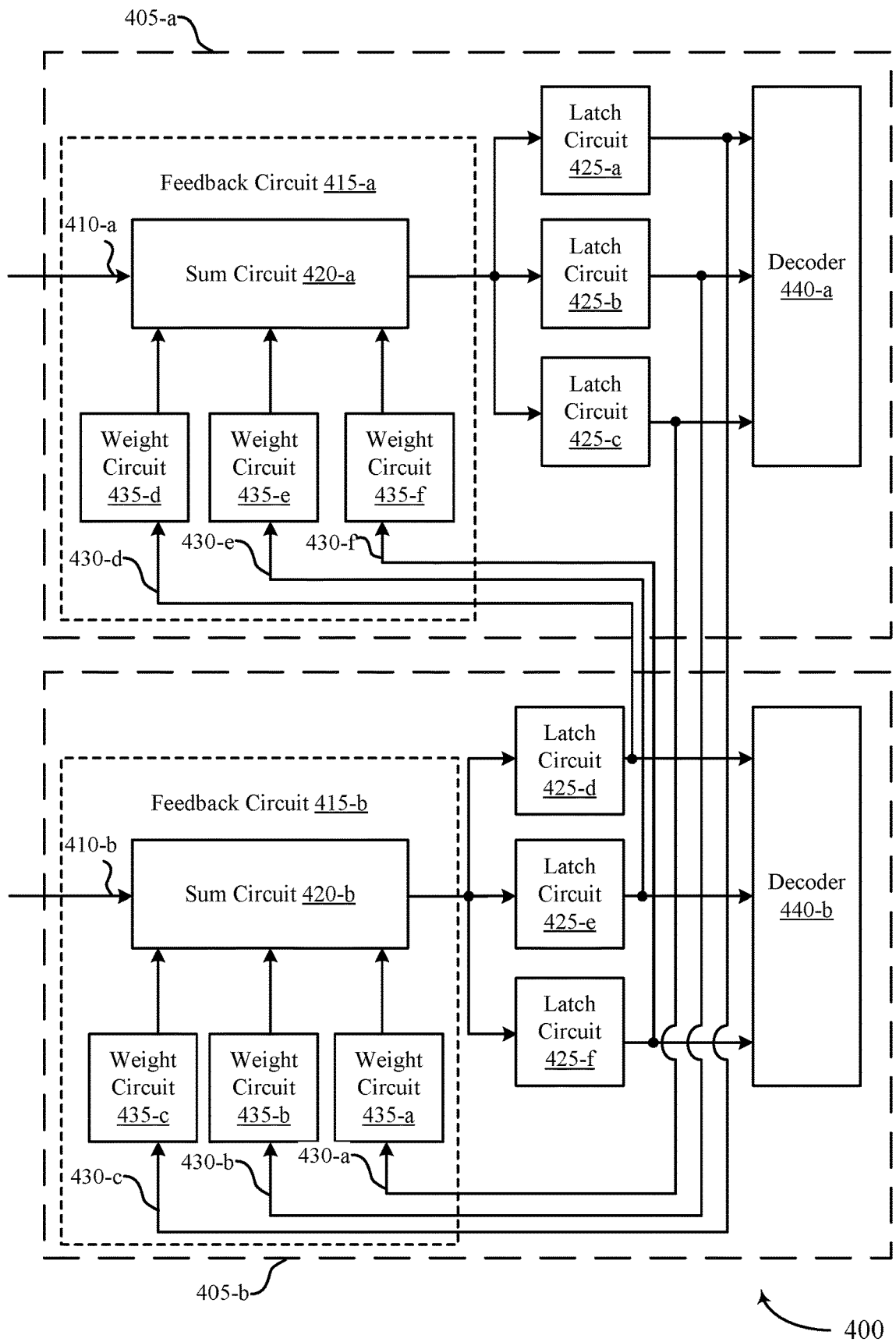
FIG. 4 illustrates an example of a circuit that supports feedback for multi-level signaling in a memory device in accordance with examples as disclosed herein.

FIG. 4 illustrates an example of a circuit 400 that supports feedback for multi-level signaling in a memory device in accordance with examples as disclosed herein. Circuit 400 may include first circuit 405-*a* and second circuit 405-*b*, which may be examples of first circuit 325-*a* and second circuit 325-*b*, respectively, as described with reference to FIG. 3. The first circuit 405-*a* and the second circuit 405-*b* may be configured to identify symbols modulated into a signal communicated over a channel. In some cases, the first circuit 405-*a* may be configured to identify a first subset of symbols in a signal (e.g., every odd-indexed symbol) and the second circuit 405-*b* may be configured to identify a second subset of symbols in the signal (e.g., every even-indexed symbol). First circuit 405-*a* may include feedback circuit 415-*a*, latch circuits 425-*a*, 425-*b*, and 425-*c*, and decoder 440-*a*, which may be examples of feedback circuit 330-*a*, latch circuit 340-*a*, and decoder 345-*a*, respectively, as described with reference to FIG. 3. Second circuit 405-*b* may include feedback circuit 415-*b*, latch circuits 425-*d*, 425-*e*, and 425-*f*, and decoder 440-*b*, which may be examples of feedback circuit 330-*b*, latch circuit 340-*b*, and decoder 345-*b*, respectively, as described with reference to FIG. 3.

Feedback circuit 415-*a* may include sum circuit 420-*a* and weight circuits 435-*d*, 435-*e*, 435-*f*, which may be examples of sum circuit 335-*a* and weight circuit 355-*a*, respectively, as described with reference to FIG. 3. Feedback circuit 415-*a* may be coupled with latch circuits 425-*a*, 425-*b*, and 425-*c*. For example, sum circuit 420-*a* may be coupled with each latch circuit 425-*a*, 425-*b*, and 425-*c*. Each latch circuit 425-*a*, 425-*b*, and 425-*c* may be an example of a strongARM latch. In some examples, first circuit 405-*a* may include less than three latch circuits or more than three latch circuits. In some examples, each latch circuit 425-*a*, 425-*b*, and 425-*c* may be coupled with decoder 440-*a*.

Feedback circuit 415-*b* may include sum circuit 420-*b* and weight circuits 435-*a*, 435-*b*, 435-*c*, which may be examples of sum circuit 335-*b* and weight circuit 355-*b*, respectively, as described with reference to FIG. 3. Feedback circuit 415-*b* may be coupled with latch circuits 425-*d*, 425-*e*, and 425-*f*. For example, sum circuit 420-*b* may be coupled with each latch circuit 425-*d*, 425-*e*, and 425-*f*. Each latch circuit

425-*d*, 425-*e*, and 425-*f* may be an example of a strongARM latch. In some examples, second circuit 405-*b* may include less than three latch circuits or more than three latch circuits. In some examples, 425-*d*, 425-*e*, and 425-*f* may be coupled with decoder 440-*b*.

In some cases, feedback circuit 415-*a* may receive signal 410-*a*, which may be an example of signal 315-*a* as described with reference to FIG. 3. Signal 410-*a* may be an example of a differential signal. In some case, signal 410-*a* may be associated with a first voltage level of the signal. In such cases, first circuit 405-*a* may determine the first voltage level of the signal. In some cases, first circuit 405-*a* may determine the first voltage level of the signal for a first sampling event associated with a rising edge of a clock signal.

In some examples, sum circuit 420-*a* may receive signal 410-*a* and output signal 410-*a* to latch circuits 425-*a*, 425-*b*, and 425-*c*. Signal 410-*a* may be an example of a differential signal that includes a true signal (e.g., P signal) and a complement signal (e.g., N signal) that is modulated using a multi-level modulation scheme (e.g., PAM4). The first circuit 405-*a* may include more than one latch circuit 425 to decode a signal modulated using a multi-level modulation scheme. For example, latch circuit 425-*a* may compare the signal to a first reference voltage. In such cases, latch circuit 425-*a* may slice the P signal at a voltage level that is set at 83% of an operation voltage plus the lowest voltage level of the modulation scheme, and the N signal at a voltage level that is set at 17% of the operation voltage plus the lowest voltage level of the modulation scheme. The operation voltage may refer to a full voltage swing of a signal modulated using the multi-level modulation scheme. For example, a modulation scheme where the highest voltage level is 2 volts and the lowest voltage level is 0.5 volts may have an operation voltage of 1.5 volts. Latch circuit 425-*b* may compare the signal to a second reference voltage different than first reference voltage. For example, latch circuit 425-*b* may slice both the P signal and the N signal at a voltage level that is set at 50% of the operation voltage plus the lowest voltage level of the modulation scheme. In some cases, latch circuit 425-*c* may compare the signal to a third reference voltage different than the first and second reference voltage. For example, latch circuit 425-*c* may slice the P signal at a voltage level that is set at 17% of the operation voltage plus the lowest voltage level of the modulation scheme and the N signal at a voltage level that is set at 83% of the operation voltage plus the lowest voltage level of the modulation scheme.

Decoder 440-*a* may identify the symbol indicated in the signal based on the combination of signals output from the latch circuits 425. Decoder 440-*a* may receive a feedback signal from each latch circuit. For example, decoder 440-*a* may receive feedback signal 430-*a* from latch circuit 425-*a* and determine a portion of information associated with a symbol of the signal based on feedback signal 430-*a*. Decoder 440-*a* may receive feedback signal 430-*b* from latch circuit 425-*b* and determine a portion of information associated with a symbol of the signal based on feedback signal 430-*b*. In some cases, decoder 440-*a* may receive feedback signal 430-*c* from latch circuit 425-*c* and determine a portion of information associated with a symbol of the signal based on feedback signal 430-*c*. Using each portion of the information, the decoder 440-*a* may be configured to determine a voltage level of the signal. For example, decoder 440-*a* may decode the signal level of the binary outputs from each latch circuit 425-*a*, 425-*b*, and 425-*c* using a thermometer coding technique. In some examples, the thermometer coding technique may be configured according to logic illustrated in TABLE 1.

TABLE 1

| Latch Circuit 425-a Output | Latch Circuit 425-b Output | Latch Circuit 425-c Output | Signal 410-a Level |
|---|---|---|---|
| P Signal | | | |
| 1 | 1 | 1 | 3 |
| 0 | 1 | 1 | 2 |
| 0 | 0 | 1 | 1 |
| 0 | 0 | 0 | 0 |
| N Signal | | | |
| 1 | 1 | 1 | 3 |
| 0 | 1 | 1 | 2 |
| 0 | 0 | 1 | 1 |
| 0 | 0 | 0 | 0 |

For example, latch circuit 425-*a*, 425-*b*, and 425-*c* each may output '1' for the P signal, and the signal 410-*a* level for the P signal may be '3' (e.g., signal level L3). In some cases, if the N signal outputs for latch circuit 425-*a*, 425-*b*, and 425-*c* may each output '0,' the signal 410-*a* level for the N signal may be '0' (e.g., signal level L0). In some examples, latch circuit 425-*a* may output '0', latch circuit 425-*b* may output '1', and latch circuit 425-*c* may output may '1' for the P signal, and signal 410-*a* level may be '2.' In some cases, for the N signal, latch circuit 425-*a* may output '1,' latch circuit 425-*b* may output '0,' and latch circuit 425-*c* may output '0,' for the N signal, and the signal 410-*a* level may be '1.' In some examples, the signal 410-*a* (e.g., PAM4 signal) may be decoded to NRZ bits.

In some cases, each latch circuit may generate a different feedback signal. For example, latch circuit 425-*a* may generate feedback signal 430-*a* and transmit feedback signal 430-*a* to feedback circuit 415-*b*. In some examples, latch circuit 425-*b* may generate feedback signal 430-*b* and transmit feedback signal 430-*b* to feedback circuit 415-*b*. Latch circuit 425-*c* may generate feedback signal 430-*c* and transmit feedback signal 430-*c* to feedback circuit 415-*b*. Each feedback signal 430-*a*, 430-*b*, and 430-*c* may be an example of a differential signal.

In some examples, each weight circuit of feedback circuit 415-*b* may weight or modify each feedback signal before the feedback signals are summed with the incoming signal. For example, weight circuit 435-*a* may receive feedback signal 430-*a* and weight the feedback signal 430-*a* based on feedback parameters. Weight circuit 435-*b* may receive feedback signal 430-*b* and weight the feedback signal 430-*b* based on feedback parameters. In some examples, weight circuit 435-*c* may receive feedback signal 430-*c* and weight the feedback signal 430-*c* based on feedback parameters. In such cases, sum circuit 420-*b* may receive each feedback signal from each weight circuit 435-*a*, 435-*b*, and 435-*c*.

Feedback circuit 415-*b* may receive signal 410-*b*, which may be an example of signal 315-*b* as described with reference to FIG. 3. Signal 410-*b* may be an example of a differential signal. In some case, signal 410-*b* may be associated with a second voltage level of the signal. In such cases, first circuit 405-*b* may determine the second voltage level of the signal. In some cases, first circuit 405-*b* may determine the second voltage level of the signal for a second sampling event associated with a falling edge of a clock signal.

Sum circuit 420-*b* may receive signal 410-*b* and output signal 410-*b* to latch circuits 425-*d*, 425-*e*, and 425-*f*. For example, latch circuit 425-*d* may compare the signal to a first reference voltage. Latch circuit 425-*e* may compare the signal to a second reference voltage different than first reference voltage. In some cases, latch circuit 425-*f* may compare the signal to a third reference voltage different than the first and second reference voltage.

Decoder 440-*b* may identify the symbol indicated in the signal based on the combination of signals output from the latch circuits 425. Decoder 440-*b* may receive a feedback signal from each latch circuit. For example, decoder 440-*b* may receive feedback signal 430-*d* from latch circuit 425-*d* and determine a portion of information associated with a symbol of the signal based on feedback signal 430-*d*. Decoder 440-*b* may receive feedback signal 430-*e* from latch circuit 425-*e* and determine a portion of information associated with a symbol of the signal based on feedback signal 430-*e*. In some cases, decoder 440-*b* may receive feedback signal 430-*f* from latch circuit 425-*f* and determine a portion of information associated with a symbol of the signal based on feedback signal 430-*f*.

In some cases, each latch circuit may generate a different feedback signal. For example, latch circuit 425-*d* may generate feedback signal 430-*d* and transmit feedback signal 430-*d* to feedback circuit 415-*a*. In some examples, latch circuit 425-*e* may generate feedback signal 430-*e* and transmit feedback signal 430-*e* to feedback circuit 415-*a*. Latch circuit 425-*f* may generate feedback signal 430-*f* and transmit feedback signal 430-*f* to feedback circuit 415-*a*. Each feedback signal 430-*d*, 430-*e*, and 430-*f* may be an example of a differential signal.

In some examples, each weight circuit of feedback circuit 415-*a* may weight or modify each feedback signal before the feedback signals are summed with the incoming signal. For example, weight circuit 435-*d* may receive feedback signal 430-*d* and weight the feedback signal 430-*d* based on feedback parameters. Weight circuit 435-*e* may receive feedback signal 430-*e* and weight the feedback signal 430-*e* based on feedback parameters. In some examples, weight circuit 435-*f* may receive feedback signal 430-*f* and weight the feedback signal 430-*f* based on feedback parameters. In such cases, sum circuit 420-*a* may receive each feedback signal from each weight circuit 435-*d*, 435-*e*, and 435-*f*.

For example, the first voltage level of the signal may be determined at first circuit 405-*a* based on feedback circuit 415-*a* modifying the signal. In such cases, feedback circuit 415-*a* may be coupled with the output of second circuit 405-*b* (e.g., feedback signals 430-*d*, 430-*e*, and 430-*f*) and the input of first circuit 405-*a* (e.g., signal 410-*a*). Feedback signals 430-*d*, 430-*e*, and 430-*f* may indicate information about the second voltage level of the second sampling event.

In some examples, the second voltage level of the signal determined at second circuit 405-*b* may be based on feedback circuit 415-*b* modifying the signal. For example, feedback circuit 415-*b* may be coupled with the output of first circuit 405-*a* (e.g., feedback signals 430-*a*, 430-*b*, and 430-*c*) and the input of second circuit 405-*b* (e.g., signal 410-*b*). Feedback signal 430-*a*, 430-*b*, and 430-*c* may indicate information about the first voltage level of the first sampling event.

Figure 5:
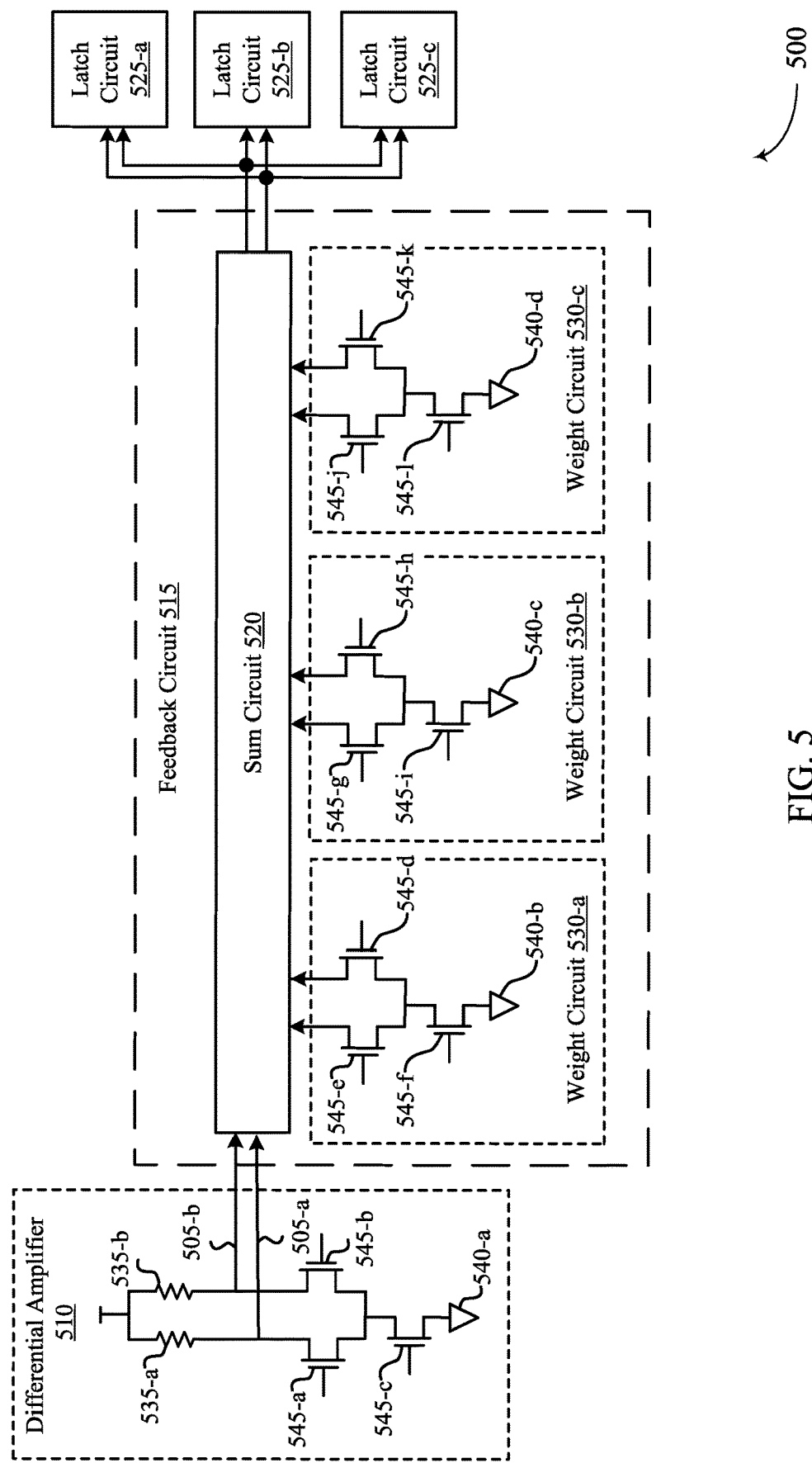
FIG. 5 illustrates an example of a circuit that supports feedback for multi-level signaling in a memory device in accordance with examples as disclosed herein.

FIG. 5 illustrates an example of a circuit 500 that supports feedback for multi-level signaling in a memory device in accordance with examples as disclosed herein. Circuit 500 may include differential amplifier 510, feedback circuit 515, and latch circuits 525-*a*, 525-*b*, and 525-*c*, which may be examples of differential amplifier, feedback circuit, and latch circuits, respectively, as described with reference to FIGS. 3 and 4. More specifically, the feedback circuit 515 may be an example of the feedback circuits 330-*a*, 330-*b*, 415-*a*, and 415-*b* described with reference to FIGS. 3 and 4 and the differential amplifier 510 may be an example of the differential amplifiers 320-*a* and 320-*b* described with reference to FIG. 3. Feedback circuit 515 may include sum circuit 520 and weight circuits 530-*a*, 530-*b*, and 530-*c*, which may be examples of sum circuit and weight circuits, respectively, as described with reference to FIGS. 3 and 4.

In some cases, differential amplifier 510 may include switching components 545-*a*, 545-*b*, and 545-*c*, and voltage source 540-*a*. Switching components 545-*a* and 545-*b* may be an example of a transistor. Switching components 545-*a* and 545-*b* may operate in a saturation mode, may achieve differential gain, and may maintain similar equivalent impedance at the output nodes for the cases of switching high and low. In some cases, switching component 545-*c* may be an example of a NMOS transistor. In such cases, switching component 545-*c* may be an example of a current source biased at a voltage supplied by voltage source 540-*a*.

In some examples, differential amplifier 510 may receive the P-signal at a gate of switching component 545-*a* and the N-signal at a gate of switching component 545-*b*. Differential amplifier 510 may then output a PAM4 differential signal. For example, differential amplifier 510 may output differential signal 505-*a* (e.g., the P-signal) into sum circuit 520 and output differential signal 505-*b* (e.g., the N-signal) into sum circuit 520. In such cases, differential amplifier 510 may be implemented before feedback circuit 515. In some cases, the equalization of differential signals 505-*a* and 505-*b* may be implemented in current mode logic (CML). Differential amplifier 510 may also include resistor 535-*a* and 535-*b*.

In some cases, one or more weight circuits may be implemented in feedback circuit 515. For example, feedback circuit may include weight circuit 530-*a*, 530-*b*, and 530-*c*. Weight circuit 530-*a* may include, switching components 545-*e*, 545-*d*, and 545-*f* and voltage source 540-*b* (e.g., a biasing voltage). Switching components 545-*e* and 545-*d* may be an example of a transistor. In some examples, switching component 545-*f* may be an example of a NMOS transistor. In some cases, the width of switching component 545-*f* may vary based on a weight applied to a feedback signal via weight circuit 530-*a*. Switching components 545-*e* and 545-*d* may be in electronic communication with sum circuit 520.

Each weight circuit 530-*a*, 530-*b*, or 530-*c* may be configured to amplify or attenuate a different feedback signal from the latch circuits 525-*a*, 525-*b*, or 525-*c*. When the feedback signals are differential signals, the P-signal may be fed into a gate of one switching component 545 (e.g., switching component 545-*e*, 545-*g*, or 545-*j*) and the N-signal may be fed into a gate of a different switching component 545 (e.g., switching component 545-*d*, 545-*h*, or 545-*k*). The amplification or attenuation of the feedback signals may be based on the value of the voltage source 540-*a*, 540-*b*, or 540-*c*, a size (e.g., a pull-down strength or a pull-up strength) of the switching components 545-*f*, 545-*i*, or 545-*l* or a combination thereof. The feedback parameter may be configured to cause the value of the voltage sources 540-*a*, 540-*b*, or 540-*c* to change or the value of the switching components 545-*f*, 545-*i*, or 545-*l* to change, or both. In some cases, the parameters of each weight circuit 530-*a*, 530-*b*, or 530-*c* may be independently configurable. In other cases, the parameters of each weight circuit 530-*a*, 530-b, or 530-c may be related or the same. The feedback parameter may indicate values to changed or set in a mode register.

In some cases, the feedback signal received at weight circuit 530-a may be added to signals 505-a and 505-b or subtracted from signals 505-a and 505-b received at sum circuit 520. In some examples, subtraction of the feedback signal may be used in lossy channels. In some cases, an extended falling edge of the clock signal may occur due to a dispersion in the pulse response (e.g., feedback signal). In some cases, feedback circuit 515 may reduce the ISI and improve the bit error rate (BER). For example, the ISI may be reduced by subtracting dispersed energy using feedback outputted by each latch circuit 525-a, 525-b, and 525-c. The feedback signal may be added to signals 505-a and 505-b at the input of each latch circuit 525-a, 525-b, and 525-c. In some cases, the feedback signal may be received at voltage source 540-c of weight circuit 530-b. For example, the feedback signal may be received at voltage source 540-c of weight circuit 530-b. In some examples, and in accordance with examples as disclosed herein, the BER may be reduced, thereby improving the signal clarity. For example, an eye diagram depicting results a feedback circuit implementation may show a larger eye height and eye width as compared to an eye diagram without implementation of a feedback circuit.

Weight circuit 530-b may include switching component 545-i, switching components 545-g and 545-h, and voltage source 540-c. Switching components 545-g and 545-h may be an example of a transistor. In some examples, switching component 545-i may be an example of a NMOS transistor. In some cases, the width of switching component 545-i may vary based on a weight applied to a feedback signal via weight circuit 530-b. Switching components 545-g and 545-h may be in electronic communication with sum circuit 520. In some cases, the feedback signal received at weight circuit 530-b may be added to signals 505-a and 505-b or subtracted from signals 505-a and 505-b received at sum circuit 520. For example, the feedback signal may be received at voltage source 540-c of weight circuit 530-b.

In some examples, weight circuit 530-c may include switching component 545-i, switching components 545-j and 545-k, and voltage source 540-d. Switching components 545-j and 545-k may be an example of a transistor. In some examples, switching component 545-i may be an example of a NMOS transistor. In some cases, the width of switching component 545-i may vary based on a weight applied to a feedback signal via weight circuit 530-c. In some cases, the widths of switching components 545-f, 545-i, and 545-l may be equal to each other.

Switching components 545-j and 545-k may be in electronic communication with sum circuit 520. In some cases, the feedback signal received at weight circuit 530-c may be added to signals 505-a and 505-b or subtracted from signals 505-a and 505-b received at sum circuit 520. For example, the feedback signal may be received at voltage source 540-d of weight circuit 530-c.

In some cases, latch circuits 525-a, 525-b, and 525-c may receive the signal from sum circuit 520. For example, latch circuit 525-a may send a first feedback signal to weight circuit 530-a, latch circuit 525-b may send a second feedback signal different than the first feedback signal to weight circuit 530-b, and latch circuit 525-c may send a third feedback signal different than the first and second feedback signal to weight circuit 530-c.

Figure 6:
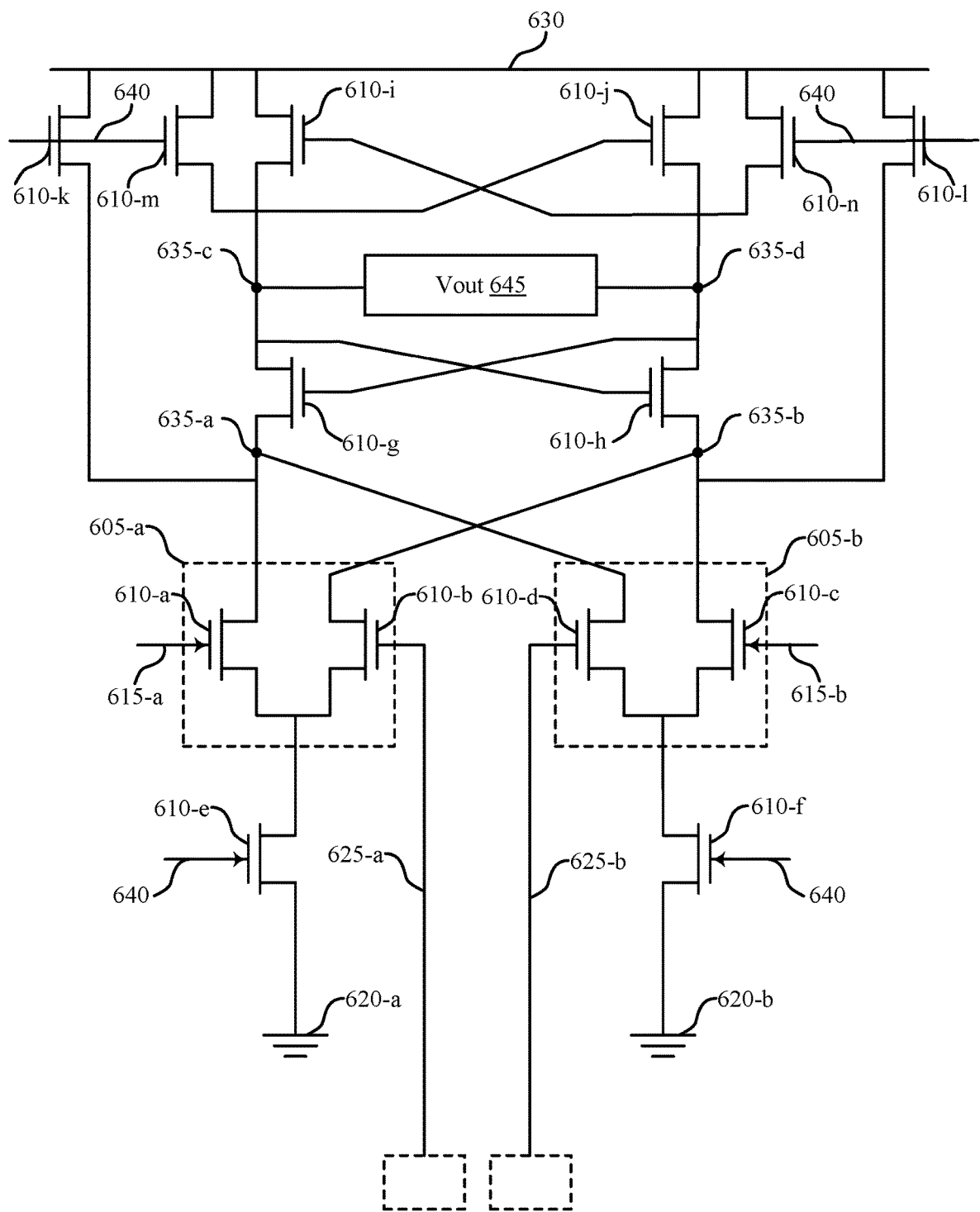
FIG. 6 illustrates an example of a latch circuit that supports feedback for multi-level signaling in a memory device in accordance with examples as disclosed herein.

FIG. 6 illustrates an example of a latch circuit 600 that supports feedback for multi-level signaling in a memory device in accordance with examples as disclosed herein. Latch circuit 600 may be an example of latch circuits 425-a, 425-b, 425-c, 425-d, 425-e, and 425-f described with reference to FIG. 4. Latch circuit 600 may compare a voltage level of a signal to a reference voltage. In some examples, the signal received at latch circuit 600 may be a PAM4 signal and/or a differential signal.

Latch circuit 600 may include first input circuit 605-a. The first input circuit 605-a may be configured to receive the P-signal or the N-signal from the sum circuit 335-a, 420-a, or 520. For example, first input circuit 605-a may include switching component 610-a (e.g., first switching component). In some examples, switching component 610-a may be an example of an NMOS transistor. Switching component 610-a may receive first signal 615-a at the gate of the switching component 610-a. The first signal 615-a may be an example of a signal output from the sum circuit 335-a, 420-a, or 520 described with reference to FIG. 3, 4, or 5. The first signal 615-a may be an example of a differential signal and/or a PAM4 signal. In some examples, first signal 615-a may be a portion of a differential PAM4 signal. An amplifier circuit (e.g., amplifier 310 described with reference to FIG. 3) may transmit first signal 615-a to first input circuit 605-a. For example, first signal 615-a may be transmitted to a gate of switching component 610-a. Latch circuit 600 may also include ground node 620-a. Ground node 620-a may be coupled to switching component 610-e. In such cases, switching component 610-e may control communication between first input circuit 605-a and ground node 620-a.

First input circuit 605-a may also include switching component 610-b (e.g., second switching component). In some examples, switching component 610-b may be an example of an NMOS transistor. Switching component 610-b may be configured to receive first control signal 625-a, which may be configured to tune the latch and thereby set, at least partially, the value of the reference voltage that is compared to the first signal 615-a. For example, first control signal 625-a may be transmitted to a gate of switching component 610-b to apply a bias to latch circuit 600.

Latch circuit 600 may include second input circuit 605-b. The second input circuit 605-b may be configured to receive the P-signal or the N-signal from the sum circuit 335-a, 420-a, or 520. For example, second input circuit 605-b may include switching component 610-c (e.g., third switching component). In some examples, switching component 610-c may be an example of an NMOS transistor. Switching component 610-c may receive second signal 615-b at a gate of the switching component 610-c. The second signal may be an example of a signal output from the sum circuit 335-a, 420-a, or 520 described with reference to FIG. 3, 4, or 5. The second signal 615-b may be an example of a differential signal and/or a PAM4 signal. In some examples, second signal 615-b may be a portion of a differential PAM4 signal.

An amplifier circuit (e.g., amplifier 310 described with reference to FIG. 3) may transmit second signal 615-b to second input circuit 605-b. For example, second signal 615-b may be transmitted to a gate of switching component 610-c. In some cases, latch circuit 600 may include ground node 620-b. Ground node 620-b may be coupled to switching component 610-f. In such cases, switching component 610-f may control communication between second input circuit 605-b and ground node 620-b.

Second input circuit 605-b may also include switching component 610-d (e.g., fourth switching component). In some examples, switching component 610-d may be an example of an NMOS transistor. Switching component 610-*d* may be configured to receive second control signal 625-*b* which may be configured to tune the latch and thereby set, at least partially, the value of the reference voltage that is compared to the second signal 615-*b*. For example, second control signal 625-*b* may be transmitted to a gate of switching component 610-*d* to apply a bias to latch circuit 600. In some examples, second control signal 625-*b* may be the same as first control signal 625-*a*. In other examples, second control signal 625-*b* may be different than first control signal 625-*a*.

Latch circuit 600 may include other circuitry for operation. In some examples, latch circuit 600 may include conductive line 630. Conductive line 630 may supply a voltage to latch circuit 600. Latch circuit 600 may also include a first pair of cross-coupled transistors. For example, the first pair of cross coupled transistors may include switching components 610-*g* and 610-*h*. Switching component 610-*g* and switching component 610-*h* may each be examples of an NMOS transistor. Latch circuit 600 may also include a second pair of cross-coupled transistors. For example, the second pair of cross coupled transistors may include switching components 610-*i* and 610-*j*. Switching component 610-*i* and switching component 610-*j* may each be examples of an NMOS transistor.

Latch circuit 600 may also include switching components 610-*k*, 610-*l*, 610-*m*, and 610-*n*. Switching components 610-*k*, 610-*l*, 610-*m*, and 610-*n* may be examples of pre-charge switches. In some cases, switching components 610-*k*, 610-*l*, 610-*m*, and 610-*n* may be examples of transistors. Latch circuit 600 may also include input signal 640. Input signal 640 may be an example of a clock signal. In some cases, input signal 640 may be transmitted to the gates of switching components 610-*e*, 610-*f*, 610-*k*, 610-*l*, 610-*m*, and 610-*n*, or a combination thereof.

Latch circuit 600 may also include nodes 635-*a*, 635-*b*, 635-*c*, and 635-*d*. Nodes 635-*a*, 635-*b*, 635-*c*, and 635-*d* may each include a capacitor. For example, the capacitors may each be an example of a parasitic capacitor.

In some examples, latch circuit 600 may compare first signal 615-*a* to a reference voltage. Latch circuit 600 may then transmit a differential signal based on the comparison between first signal 615-*a* and the reference voltage. The reference voltage may be biased by first control signal 625-*a*. For example, switching component 610-*b* may receive first control signal 625-*a*, and may provide an additional discharge path for node 635-*b*. The additional discharge path for node 635-*b* may change the reference voltage. In some examples, the reference voltage may be set at 83% of a maximum operation voltage plus the lowest voltage level of the modulation scheme. The maximum operation voltage may refer to a full voltage swing of a signal modulated using the multi-level modulation scheme. For example, a modulation scheme where the highest voltage level is 2 volts and the lowest voltage level is 0.5 volts may have a maximum operation voltage of 2 volts. In other examples, the reference voltage may be set at 50% of a maximum operation voltage plus the lowest voltage level of the modulation scheme. In some cases, the reference voltage may be set at 17% of the maximum operation voltage plus the lowest voltage level of the modulation scheme.

In some examples, latch circuit 600 may compare second signal 615-*b* to a reference voltage. Latch circuit 600 may then transmit a differential signal based on the comparison between second signal 615-*b* and the reference voltage. The reference voltage may be biased by second control signal 625-*b*. For example, switching component 610-*d* may receive second control signal 625-*b*, and may provide an additional discharge path for node 635-*a*. The additional discharge path for node 635-*a* may change the reference voltage. In some examples, the reference voltage may be set at 17% of a maximum operation voltage plus the lowest voltage level of the modulation scheme. In some examples, the reference voltage may be set at 50% of a maximum operation voltage plus the lowest voltage level of the modulation scheme. In some examples, the reference voltage may be set at 83% of the maximum operation voltage plus the lowest voltage level of the modulation scheme. The reference voltage may be determined in accordance with a desired modulation scheme (e.g., PAM4 modulation scheme).

In some examples, input signal 640 may be a low clock signal. In such cases, switching components 610-*k*, 610-*l*, 610-*m*, and 610-*n* may each receive input signal 640. For example, switching component 610-*k* may receive input signal 640. In some examples, switching component 610-*k* may receive input signal 640 and allow communication between conductive line 630 and node 635-*a*. In such cases, node 635-*a* may be charged to the voltage of conductive line 630, and the parasitic capacitor at node 635-*a* may be charged to the voltage of conductive line 630. Switching component 610-*l* may receive input signal 640, and may allow communication between conductive line 630 and node 635-*b*. In such cases, node 635-*b* may be charged to the voltage of conductive line 630, and the parasitic capacitor at node 635-*b* may be charged to the voltage of conductive line 630.

Switching component 610-*m* may receive input signal 640, and may allow communication between conductive line 630 and node 635-*c*. In such cases, node 635-*c* may be charged to the voltage of conductive line 630, and the parasitic capacitor at node 635-*c* may be charged to the voltage of conductive line 630. In some cases, switching component 610-*n* may receive input signal 640, and may allow communication between conductive line 630 and node 635-*d*. In such cases, node 635-*d* may be charged to the voltage of conductive line 630, and the parasitic capacitor at node 635-*d* may be charged to the voltage of conductive line 630.

When input signal 640 is a low clock signal, the first pair of cross-coupled transistors (e.g., switching components 610-*g* and 610-*h*) may each be off (e.g., deactivated). In such cases, the gate voltage of each switching component 610-*g* and 610-*h* may be less than a threshold voltage of the activation of the switching components. In other examples, the second pair of cross-coupled transistors (e.g., switching components 610-*i* and 610-*j*) may each be off (e.g., deactivated). In such cases, the gate voltage of each switching component 610-*i* and 610-*j* may be less than a threshold voltage of the activation of the switching components.

In some examples, input signal 640 may be a high clock signal. In such cases, switching components 610-*k*, 610-*l*, 610-*m*, and 610-*n* may each receive input signal 640 and turn off. In other examples when input signal 640 is a high clock signal, the gate voltage of switching component 610-*a* may be greater than a threshold voltage of the activation of switching component 610-*a*. In such cases, switching component 610-*a* may turn on (e.g., activated). In some examples when input signal 640 is a high clock signal, the gate voltage of switching component 610-*c* may be greater than a threshold voltage of the activation of switching component 610-*c*. In such cases, switching component 610-*c* may turn on.

In some examples, when input signal 640 is a high clock signal, the voltages of nodes 635-*a* and 635-*b* may start to decrease. In such cases, the voltage of node 635-*a* may decrease due to the discharge effect of the parasitic capacitors at node 635-*a*. The voltage of node 635-*b* may decrease due to the discharge effect of the parasitic capacitor at node 635-*b*. In some cases, the voltages of node 635-*a* and node 635-*b* may decrease at different rates. In such cases, the voltage difference between nodes 635-*a* and 635-*b* may increase at a rate proportional to the difference between first signal 615-*a* and second signal 615-*b*.

In some examples, the voltage difference between node 635-*a* and node 635-*b* may reach a value equal to the difference between the voltage of conductive line 630 and a first set threshold voltage. In such cases, the first cross-coupled pair of transistors (e.g., switching components 610-*g* and 610-*h*) may then turn on. In some examples, the first set threshold voltage may be biased by first control signal 625-*a*, second control signal 625-*b*, or both.

In some examples, when input signal 640 is a high clock signal, the voltages of nodes 635-*c* and 635-*d* may start to decrease. In such cases, the voltage of node 635-*c* may decrease due to the discharge effect of the parasitic capacitors at node 635-*c*. The voltage of node 635-*d* may decrease due to the discharge effect of the parasitic capacitor at node 635-*d*.

In some examples, the voltage difference between node 635-*c* and node 635-*d* may reach a value equal to the difference between the voltage of conductive line 630 and a second set threshold voltage. In such cases, the second cross-coupled pair of transistors (e.g., switching components 610-*i* and 610-*j*) may then turn on. In some examples, the second set threshold voltage may be biased by first control signal 625-*a*, second control signal 625-*b*, or both. In some examples, the second set threshold voltage may be different than the first set threshold voltage. In other examples, the second set threshold voltage may be the same as the first set threshold voltage.

In some examples, the first cross-coupled pair of transistors (e.g., switching components 610-*i* and 610-*j*) may provide a feedback loop with the second cross-coupled pair of transistors (e.g., switching components 610-*g* and 610-*h*). For example, switching component 610-*g* may control a signal transmitted to the gate of switching component 610-*j*. In other examples, switching component 610-*j* may control a signal transmitted to the gate of switching component 610-*g*. In some cases, switching component 610-*h* may control a signal transmitted to the gate of switching component 610-*i*. In other examples, switching component 610-*i* may control a signal transmitted to the gate of switching component 610-*h*.

In some examples, the feedback loop may be a positive feedback loop. For example, node 635-*d* may reach a voltage equal to the voltage of conductive line 630 and node 635-*c* may reach a voltage of zero volts. In some examples, node 635-*c* may reach a voltage equal to the voltage of conductive line 630 and node 635-*d* may reach a voltage of zero volts. In such cases, the gate voltage of switching component 610-*a* may be more than the gate voltage of switching component 610-*c*. In some examples, the parasitic capacitor at node 635-*a* may discharge at a faster rate than the parasitic node at node 635-*b*. In some cases, the parasitic capacitor at node 635-*c* may discharge at a faster rate than the parasitic capacitor at node 635-*d*.

In some examples, latch circuit 600 may be configured to receive a differential signal (e.g., first signal 615-*a* and second 615-*b*) and output a differential signal to Vout 645, described below in further detail. In some examples, node 635-*c* may be in electronic communication with Vout 645 to output first signal 615-*a*. Node 635-*d* may be in electronic communication with Vout 645 to output second signal 615-*b* to Vout 645. In such cases, Vout 645 may be an example of a second latch configured to compare the voltage level of the signal to a second reference voltage. Vout 645 may be an example of a Set-Reset (SR) latch. In some cases, Vout 645 may output first signal 615-*a* and second signal 615-*b* to latch circuits (e.g., latch circuits 340 or latch circuits 425 as described with reference to FIG. 3 or 4). The second latch may include a third input circuit and a fourth input circuit. In some cases, Vout 645 may be an example of a third latch configured to compare the voltage of the signal to a third reference voltage. The third latch may include a fifth input circuit and a sixth input circuit.

Figure 7:
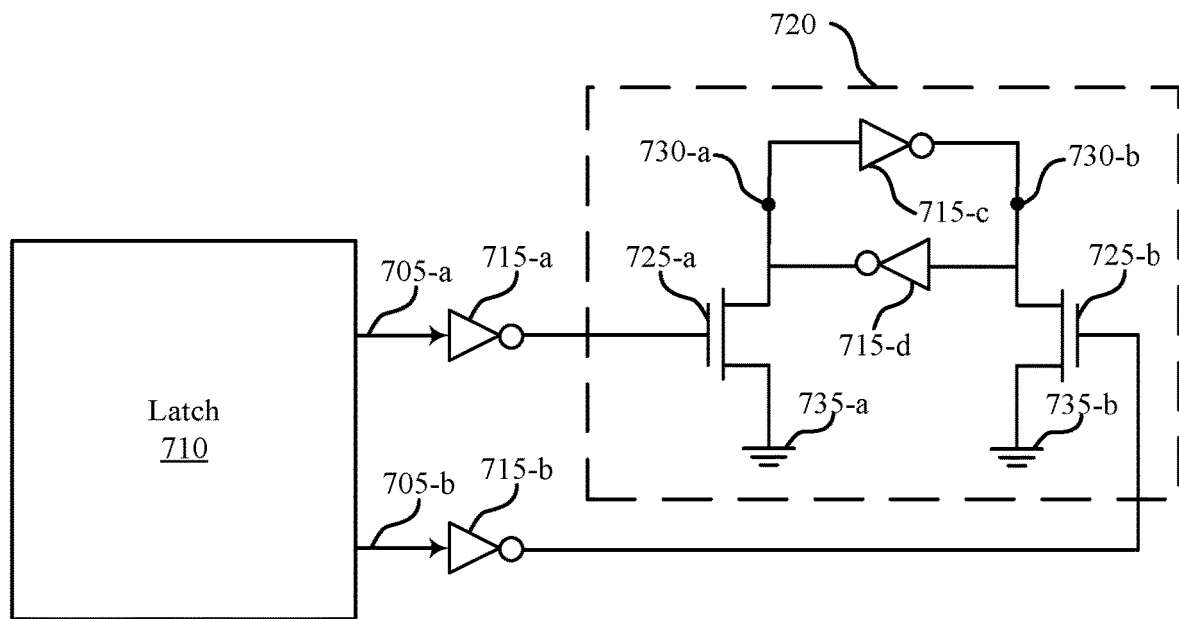
FIG. 7 illustrates an example of a latch circuit that supports feedback for multi-level signaling in a memory device in accordance with examples as disclosed herein.

FIG. 7 illustrates an example of a latch circuit 700 that supports feedback for multi-level signaling in a memory device in accordance with examples as disclosed herein. Latch circuit 700 may include latch 710 and 720. Latch 710 may be an example of latch circuit 600 described with reference to FIG. 6. Latch circuit 700 may be an example of latch circuits 425-*a*, 425-*b*, 425-*c*, 425-*d*, 425-*e*, and 425-*f* described with reference to FIG. 4.

Latch 720 may be an example of a SR latch. In some cases, latch 720 may be configured to receive a signal from latch 710 and store data associated with the signal from latch 710. For example, latch 720 may receive first signal 705-*a* and second signal 705-*b* from latch 710. In some examples, first signal 705-*a* and second signal 705-*b* may each be a differential PAM4 signal. In such cases, first signal 705-*a* and second signal 705-*b* may each be an example of a voltage signals that may be modulated to contain binary voltage data.

Latch 720 may include switching component 725-*a* and switching component 725-*b*. In some examples, switching component 725-*a* and switching component 725-*b* may each be examples of an NMOS transistor. In some examples, switching component 725-*a* may receive first signal 705-*a*. In some cases, inverter 715-*a* may transmit first signal 705-*a* to switching component 725-*a*. In such cases, first signal 705-*a* may be transmitted to a gate of switching component 725-*a*. Switching component 725-*b* may receive second signal 705-*b*. In some cases, inverter 715-*b* may transmit second signal 705-*b* to switching component 725-*b*. In such cases, second signal 705-*b* may be transmitted to a gate of switching component 725-*b*.

Latch 720 may include inverter 715-*c* and inverter 715-*d*. In some cases, inverter 715-*c* may be cross-coupled to inverter 715-*d*. In such cases, inverter 715-*c* and inverter 715-*d* may be configured to store binary data from first signal 705-*a* and second signal 705-*b*, respectively. Latch 720 may also include node 730-*a* and node 730-*b*. Node 730-*a* may be coupled to the input of inverter 715-*c* and the output of inverter 715-*d*. Node 730-*b* may be coupled to the output of inverter 715-*c* and the input of inverter 715-*d*. In some examples, node 730-*a* and node 730-*b* may be configured to store binary data. For example, node 730-*a* and node 730-*b* may be configured to store complementary binary data from first signal 705-*a* and second signal 705-*b*, respectively.

In some cases, latch 720 may also include ground node 735-*a* and ground node 735-*b*. Ground node 735-*a* may be coupled to switching component 725-*a* where switching component 725-*a* may control communication between node 730-*a* and ground node 735-*a*. In some examples, ground node 735-*b* may be coupled to switching component 725-*b* where switching component 725-*b* may control communication between node 730-*b* and ground node 735-*b*.

In some examples, latch 720 may sample data from latch 710. In some examples, switching component 725-*a* and 725-*b* may sample data using a forcing methodology. In some examples, switching component 725-*a* may sample voltage data from first signal 705-*a*. Switching component 725-*a* may then transmit voltage data to node 730-*a* for storage. In some examples, switching component 725-*b* may sample voltage data from second signal 705-*b*. Switching component 725-*b* may then transmit voltage data to node 730-*b* for storage.

In some cases, a sampling event may occur when the latch 720 is fired. For example, the latch 710 may be comparing the incoming signal to a reference voltage at all times. The value output from the from latch 710 may not always include information that is useful for a decoder or useful for feedback. When the latch 720 is activated or fired, the latch 720 may store the value the signals being output from the latch 710. The timing of the activation may be configured to ensure that the latch is likely outputting valuable information at the time of activation.

In some examples, if the voltage of first signal 705-*a* reaches a threshold voltage, node 730-*a* may be a first voltage value. If the voltage of first signal 705-*a* is below the threshold voltage, node 730-*a* may become a second voltage value. In some cases, the first voltage value may be higher than the second voltage value. For example, the first voltage value may be the voltage value of conductive line 630, as described in reference to FIG. 6. In some cases, the second voltage value may be zero volts. In other examples, if the voltage of first signal 705-*b* reaches a threshold voltage, node 730-*b* may be the first voltage value. If the voltage of second signal 705-*b* is below the threshold voltage, node 730-*b* may be a second voltage value. In some cases, the first voltage value may be higher than the second voltage value. For example, the first voltage value may be the voltage value of conductive line 630, as described in reference to FIG. 6. In some cases, the second voltage value may be zero volts.

Figure 8:
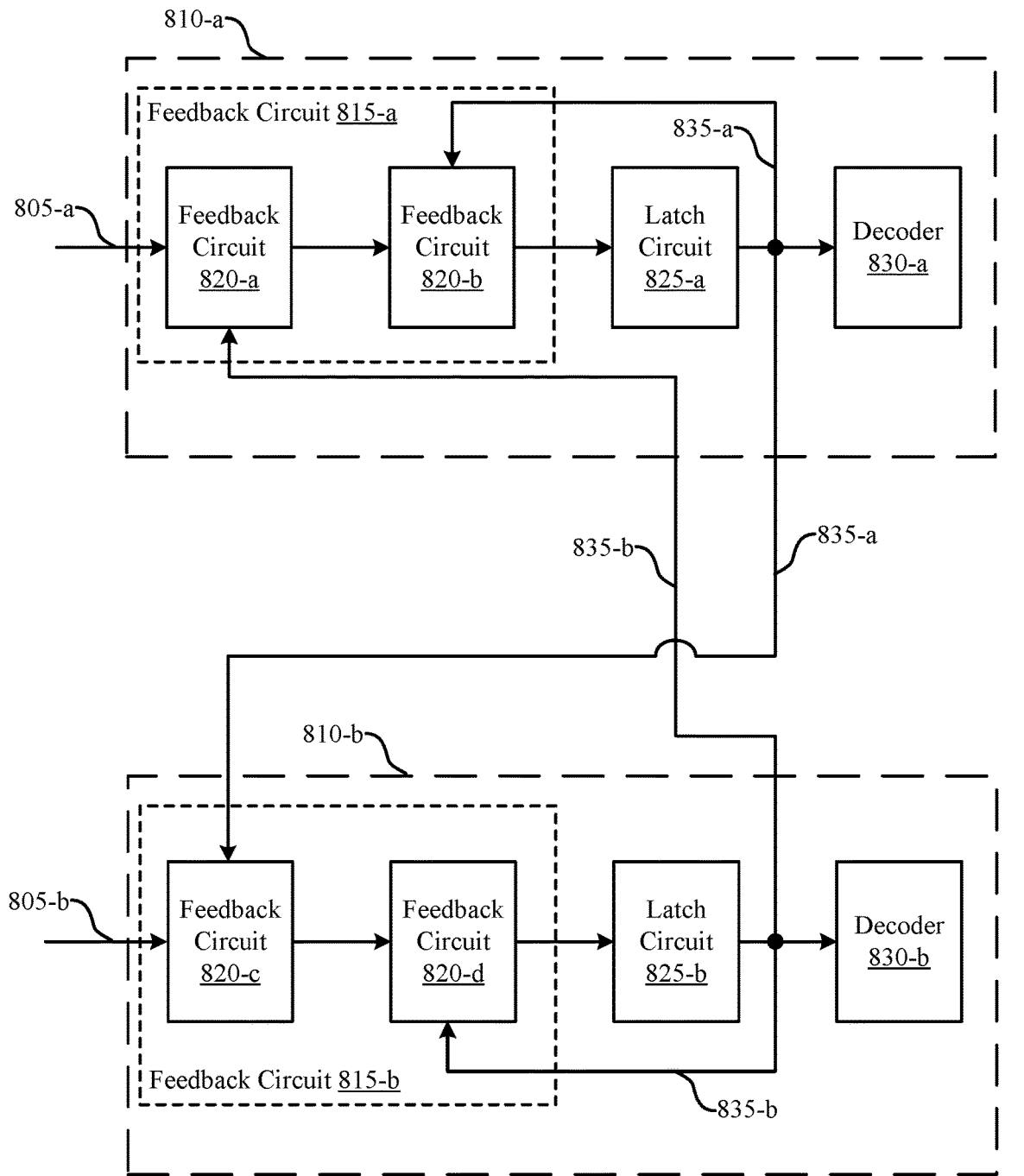
FIG. 8 illustrates an example of a circuit that supports feedback for multi-level signaling in a memory device in accordance with examples as disclosed herein.

FIG. 8 illustrates an example of a circuit 800 that supports feedback for multi-level signaling in a memory device in accordance with examples as disclosed herein. Circuit 800 may include first circuit 810-*a* and second circuit 810-*b*, which may be examples of first circuit 325-*a* and 405-*a* and second circuit 325-*b* and 405-*b*, respectively, as described with reference to FIGS. 3 and 4. The first circuit 810-*a* and the second circuit 810-*b* may be examples of multi-tap circuits that incorporate feedback from both branches of a DDR receiver circuit. First circuit 810-*a* may include multi-tap feedback circuit 815-*a*, latch circuit 825-*a*, and decoder 830-*a*, which may be examples of feedback circuit, latch circuit, and decoder, respectively, as described with reference to FIGS. 3-5. Second circuit 810-*b* may include multi-tap feedback circuit 815-*b*, latch circuit 825-*b*, and decoder 830-*b*, which may be examples of feedback circuit, latch circuit, and decoder, respectively, as described with reference to FIGS. 3-5.

Inter-symbol interference caused by a symbol at a first sampling event may affect more than one subsequent symbols at more than one subsequent sampling events. For example, an Nth symbol may interfere with the N+1 symbol, the N+2 symbol, the N+3 symbol and so forth. When a receiver includes a split structure, where one circuit determines information about a first subset of symbols (e.g., N, N+2, N+4, etc.) and another circuit determines information about a second subset of symbols (e.g., N+1, N+3, N+5, etc.), the feedback to reduce errors caused by inter-symbol interference may become more complex. The circuit 800 illustrates feedback paths between the different circuits 810-*a* and 810-*b* (e.g., feedback signals 835-*a* and 835-*b*) and feedback paths within the same circuits 810-*a* and 810-*b* (e.g., feedback signals 835-*c* and 835-*d*). To facilitate these different feedback paths, different delay circuits must be added to each multi-tap feedback circuit 815-*a* and 815-*b*.

Feedback circuit 815-*a* may include one or more feedback circuits 820-*a* and 820-*b*. The feedback circuit 820-*a* may be configured to receive feedback signals from the circuit 810-*b* and the feedback circuit 820-*b* may be configured to receive feedback signals from the circuit 810-*a*. In some cases, the feedback circuits 820-*a* and 820-*b* may be incorporated into the same feedback circuit. The feedback circuits 820-*a* and 820-*b* may include different configurations of delay circuits to ensure that the feedback signals are applied to the correct sampling time.

Feedback circuit 820-*a* and 820-*b* may each include one or more weight circuits and/or one or more delay circuits. In some cases, the one or more delay circuits may be an example of a clock delay element (e.g., D-FlipFlop (DFF)). In some cases, a first DFF may be excluded when the latch circuit 825-*a* and feedback circuit 820-*a* and 820-*b* may be close to the first sampling event. In some examples, loop unrolling may be used to overcome a timing constraint of a first weight circuit (e.g., included in feedback circuit 820-*a*), and half rate and quarter rate architectures may be used to reduce the timing of subsequent weight circuits due to less PVT variation at lower clock signal speed.

In some cases, feedback circuit 820-*a* may be coupled to an input of first circuit 810-*a* and an output (e.g., feedback signal 835-*b*) of second circuit 810-*b*. feedback circuit 820-*b* may be coupled with the input of the first circuit 810-*a* and an output (e.g., feedback signal 835-*a*) of first circuit 810-*a*.

In some examples, feedback circuit 815-*a* may be coupled with latch circuit 825-*a*. For example, feedback circuit 820-*a* may be coupled with feedback circuit 820-*b*. In such cases, feedback circuit 820-*b* may be coupled with latch circuit 825-*a*. Latch circuit 825-*a* may include a strongARM latch. In some examples, latch circuit 825-*a* may be coupled with decoder 830-*a*.

Feedback circuit 815-*b* may include one or more feedback circuits 820-*c* and 820-*d*. The feedback circuit 820-*c* may be configured to receive feedback signals from the circuit 810-*a*, and the feedback circuit 820-*d* may be configured to receive feedback signals from the circuit 810-*b*. In some cases, the feedback circuits 820-*c* and 820-*d* may be incorporated into the same feedback circuit. The feedback circuits 820-*c* and 820-*d* may include different configurations of delay circuits to ensure that the feedback signals are applied to the correct sampling time.

Feedback circuit 820-*c* and 820-*d* may each include one or more weight circuits and/or one or more delay circuits. In some cases, the one or more delay circuits may be an example of a clock delay element (e.g., DFF). feedback circuit 820-*c* may be coupled to an input of second circuit 810-*b* and an output (e.g., feedback signal 835-*a*) of first circuit 810-*a*. feedback circuit 820-*d* may be coupled with the input of second circuit 810-*b* and an output (e.g., feedback signal 835-*b*) of second circuit 810-*b*.

In some cases, feedback circuit 815-*b* may be coupled with latch circuit 825-*b*. For example, feedback circuit 820-*c* may be coupled with feedback circuit 820-*d*. In such cases, feedback circuit 820-*d* may be coupled with latch circuit 825-*b*. Latch circuit 825-*b* may include a strongARM latch. In some examples, latch circuit 825-*b* may be coupled with decoder 830-*b*.

In some cases, feedback circuit 815-*a* may receive signal 805-*a*, which may be an example of signal as described with reference to FIGS. 3-5. Signal 805-*a* may be an example of a differential signal. In some case, signal 805-*a* may be associated with a first voltage level of the signal. In such cases, first circuit 810-*a* may determine the first voltage level of the signal. In some cases, first circuit 810-*a* may determine the first voltage level of the signal for a first sampling event associated with a rising edge of a clock signal.

In some examples, feedback circuit 815-*a* may receive signal 805-*a* and output signal 805-*a* to latch circuit 825-*a*. In some cases, latch circuit 825-*a* may generate feedback signal 835-*a* and transmit feedback signal 835-*a* to feedback circuit 815-*b* and feedback circuit 815-*b*. In such cases, feedback circuit 820-*c* may receive feedback signal 835-*a*. For example, feedback circuit 820-*c* may modify the signal input in second circuit 810-*b* for a plurality of sampling events associated with the clock signal after the first sampling event (e.g., after first circuit 810-*a* determines the first voltage level of the signal for the first sampling event).

In other examples, feedback circuit 820-*b* may receive feedback signal 835-*a*. For example, feedback circuit 820-*b* may delay feedback signal 835-*a* at least one sampling event associated with the clock signal. In such cases, feedback circuit 820-*b* may modify signal 805-*a* input into first circuit 810-*a* for a plurality of sampling events that occur after the first sampling event. In some cases, decoder 830-*a* may receive feedback signal 835-*a* from latch circuit 825-*a*. For example, decoder 830-*a* may receive feedback signal 835-*a* from latch circuit 825-*a* and determine a symbol associated with signal 805-*a* based on feedback signal 835-*a*.

Feedback circuit 815-*b* may receive signal 805-*b*, which may be an example of signal 410-*b* as described with reference to FIG. 4. Signal 805-*b* may be an example of a differential signal. In some case, signal 805-*b* may be associated with a second voltage level of the signal. In such cases, second circuit 810-*b* may determine the second voltage level of the signal. In some cases, second circuit 810-*b* may determine the second voltage level of the signal for a second sampling event associated with a falling edge of a clock signal.

In some examples, feedback circuit 815-*b* may receive signal 805-*b* and output signal 805-*b* to latch circuit 825-*b*. In some cases, latch circuit 825-*b* may generate feedback signal 835-*b* and transmit feedback signal 835-*b* to feedback circuit 815-*a* and feedback circuit 815-*b*. In such cases, feedback circuit 820-*a* may receive feedback signal 835-*b*. For example, feedback circuit 820-*a* may delay feedback signal 835-*b*. In such cases, feedback circuit 820-*a* may receive feedback signal 835-*b* and modify signal 805-*a* for a plurality of sampling events that occur after the second sampling event. For example, the modification of signal 805-*a* may be based on the second voltage determined in second circuit 810-*b*.

In other examples, feedback circuit 820-*d* may receive feedback signal 835-*b*. For example, feedback circuit 820-*d* may delay feedback signal 835-*b* at least one sampling event associated with the clock signal. In such cases, feedback circuit 820-*d* may modify signal 805-*b* input into second circuit 810-*b* for a plurality of sampling events that occur after the second sampling event. In some cases, decoder 830-*b* may receive feedback signal 835-*b* from latch circuit 825-*b*. For example, decoder 830-*b* may determine a symbol associated with signal 805-*b* based on feedback signal 835-*b*.

Figure 9:
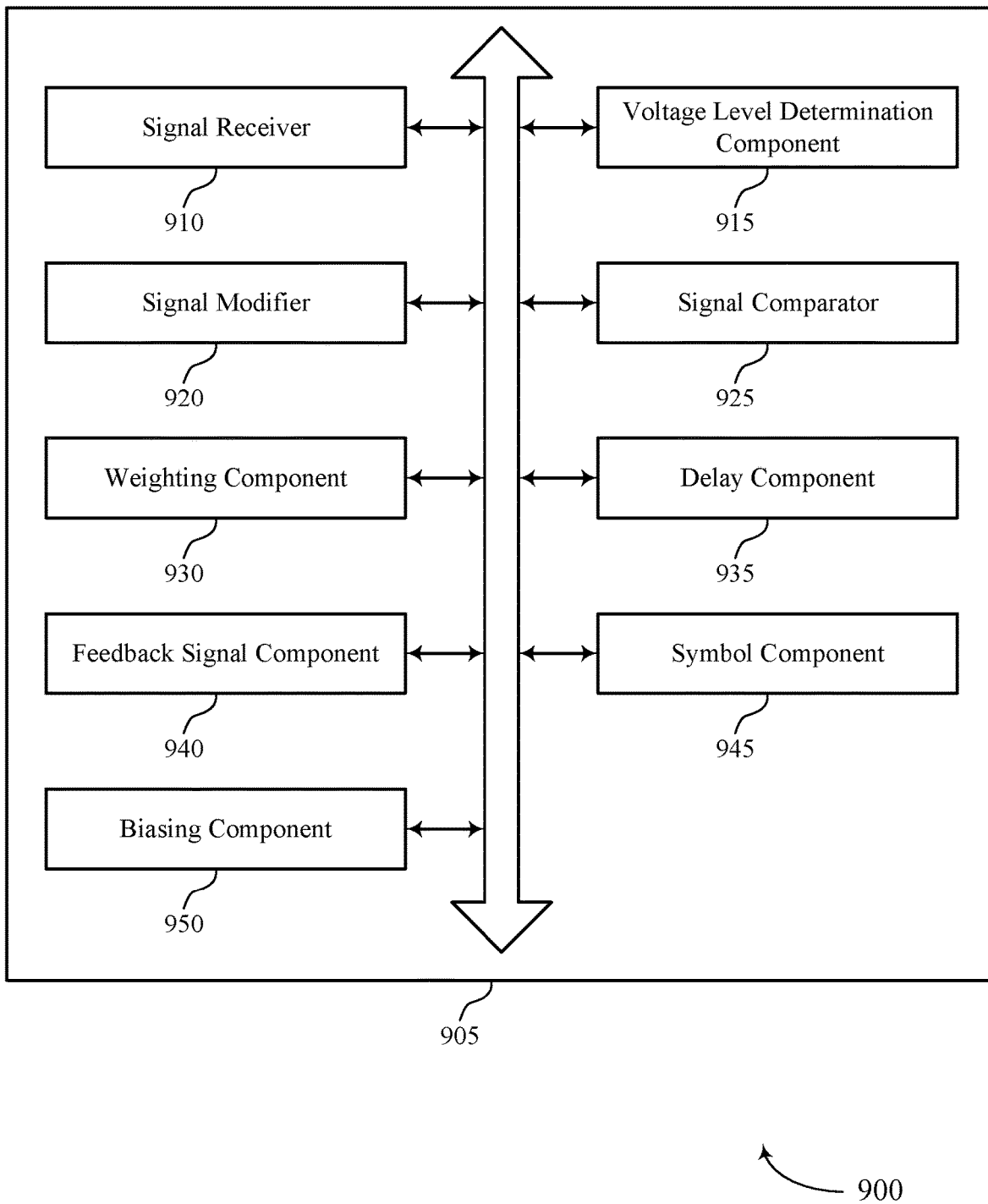
FIG. 9 shows a block diagram of a memory device that supports feedback for multi-level signaling in a memory device in accordance with examples as disclosed herein.

FIG. 9 shows a block diagram 900 of a memory device 905 that supports feedback for multi-level signaling in a memory device in accordance with examples as disclosed herein. The memory device 905 may be an example of aspects of the memory devices 110 and 200 described with reference to FIGS. 1 and 2. The memory device 905 may include a signal receiver 910, a voltage level determination component 915, a signal modifier 920, a signal comparator 925, a weighting component 930, a delay component 935, a feedback signal component 940, a symbol component 945, and a biasing component 950. Each of these components may communicate, directly or indirectly, with one another (e.g., via one or more buses).

The signal receiver 910 may receive a signal modulated using a modulation scheme that includes three or more voltage levels. In some examples, the signal receiver 910 may receive a first differential portion and a second differential portion of a signal modulated using a modulation scheme that includes three or more voltage levels. In some examples, the signal receiver 910 may receive, by a decoder, the first feedback signal and the second feedback signal.

In some examples, the signal receiver 910 may receive a single-ended signal over a channel coupled with a host device and a memory device. In some examples, the signal receiver 910 may receive a first control signal, where applying the first bias is based on receiving the first control signal. In some examples, the signal receiver 910 may receive a second control signal, where applying the second bias is based on receiving the second control signal.

The voltage level determination component 915 may determine, by a first circuit during a first sampling event associated with a rising edge of a clock signal, a first voltage level of the signal. In some examples, the voltage level determination component 915 may determine, by the second circuit during the second sampling event, a second voltage level of the signal based on modifying the signal being input into the second circuit. In some examples, the voltage level determination component 915 may identify at least a portion of a voltage level of the signal based on applying the first bias to the first differential portion and applying the second bias to the second differential portion.

The signal modifier 920 may modify, by a feedback circuit, the signal sent to a second circuit during a second sampling event associated with a falling edge of the clock signal based on determining the first voltage level that occurs at the first sampling event. In some examples, outputting a differential signal may be based on receiving the single-ended signal, where the signal includes the differential signal.

The signal comparator 925 may compare the signal to a first reference voltage, where modifying the signal is based at least in part comparing the signal to the first reference voltage. In some examples, the signal comparator 925 may compare the signal to a second reference voltage, where modifying the signal is based at least in part comparing the signal to the first reference voltage.

In some examples, the signal comparator 925 may compare the first voltage level of the first differential portion of the signal to a first reference voltage based on applying the first bias. In some examples, the signal comparator 925 may compare the second voltage level of the second differential portion of the signal to a second reference voltage based on applying the second bias.

The weighting component 930 may weigh the first feedback signal and the second feedback signal based on at least one feedback parameter, where modifying the signal is based on weighting the first feedback signal and the second feedback signal.

The delay component 935 may delay the first feedback signal, where modifying the signal input into the second circuit is based on delaying the first feedback signal.

The feedback signal component 940 may send a first feedback signal to the feedback circuit based on comparing the signal to the first reference voltage. In some examples, the feedback signal component 940 may send a second feedback signal to the feedback circuit based on comparing the signal to the second reference voltage, where modifying the signal input into the second circuit is based on sending the first feedback signal and the second feedback signal.

In some examples, the feedback signal component 940 may output the first differential portion of a feedback signal based on comparing the first differential portion of the signal to the first reference voltage. In some examples, the feedback signal component 940 may output the second differential portion of the feedback signal based on comparing the second differential portion of the signal to the second reference voltage.

The symbol component 945 may determine a symbol of the signal transmitted during the first sampling event based on receiving the first feedback signal and the second feedback signal.

The biasing component 950 may apply a first bias to the first differential portion to identify a first voltage level of the first differential portion based on receiving the first differential portion of the signal. In some examples, the biasing component 950 may apply a second bias to the second differential portion to identify a second voltage level of the second differential portion based on receiving the second differential portion of the signal, where the second bias is different than the first bias.

Figure 10:
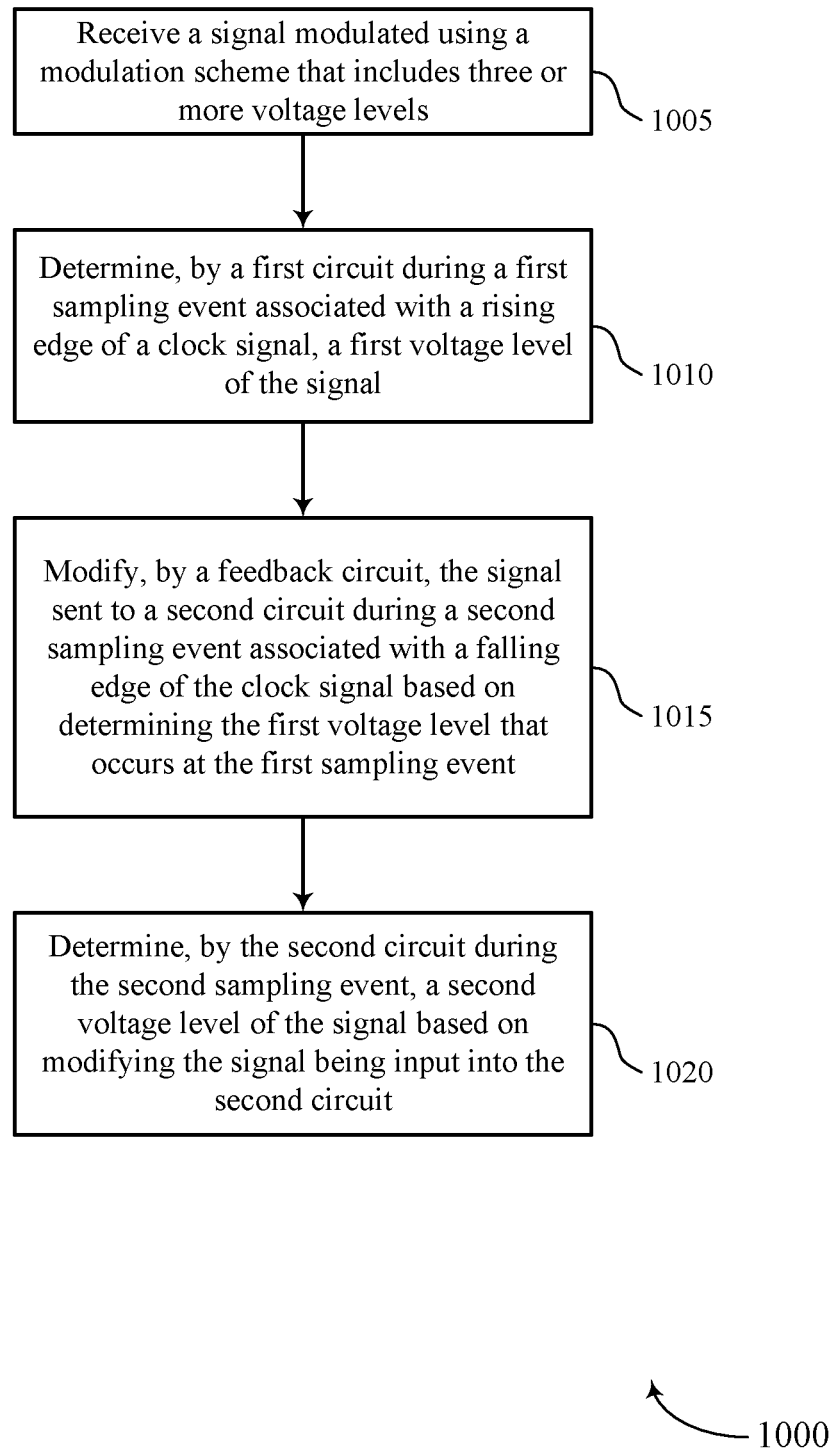
FIGS. 10 and 11 show flowcharts illustrating a method or methods that support feedback for multi-level signaling in a memory device in accordance with examples as disclosed herein.

FIG. 10 shows a flowchart illustrating a method or methods 1000 that supports feedback for multi-level signaling in a memory device in accordance with examples as disclosed herein. The operations of method 1000 may be implemented by a memory device or its components as described herein. For example, the operations of method 1000 may be performed by a memory device as described with reference to FIG. 9. In some examples, a memory device may execute a set of instructions to control the functional elements of the memory device to perform the described functions. Additionally or alternatively, a memory device may perform aspects of the described functions using special-purpose hardware.

At 1005, the memory device may receive a signal modulated using a modulation scheme that includes three or more voltage levels. The operations of 1005 may be performed according to the methods described herein. In some examples, aspects of the operations of 1005 may be performed by a signal receiver as described with reference to FIG. 9.

At 1010, the memory device may determine, by a first circuit during a first sampling event associated with a rising edge of a clock signal, a first voltage level of the signal. The operations of 1010 may be performed according to the methods described herein. In some examples, aspects of the operations of 1010 may be performed by a voltage level determination component as described with reference to FIG. 9.

At 1015, the memory device may modify, by a feedback circuit, the signal sent to a second circuit during a second sampling event associated with a falling edge of the clock signal based on determining the first voltage level that occurs at the first sampling event. The operations of 1015 may be performed according to the methods described herein. In some examples, aspects of the operations of 1015 may be performed by a signal modifier as described with reference to FIG. 9.

At 1020, the memory device may determine, by the second circuit during the second sampling event, a second voltage level of the signal based on modifying the signal being input into the second circuit. The operations of 1020 may be performed according to the methods described herein. In some examples, aspects of the operations of 1020 may be performed by a voltage level determination component as described with reference to FIG. 9.

In some examples, an apparatus as described herein may perform a method or methods, such as the method 1000. The apparatus may include features, means, or instructions (e.g., a non-transitory computer-readable medium storing instructions executable by a processor) for receiving a signal modulated using a modulation scheme that includes three or more voltage levels, determining, by a first circuit during a first sampling event associated with a rising edge of a clock signal, a first voltage level of the signal, modifying, by a feedback circuit, the signal sent to a second circuit during a second sampling event associated with a falling edge of the clock signal based on determining the first voltage level that occurs at the first sampling event, and determining, by the second circuit during the second sampling event, a second voltage level of the signal based on modifying the signal being input into the second circuit.

Some examples of the method 1000 and the apparatus described herein may further include operations, features, means, or instructions for comparing the signal to a first reference voltage, where modifying the signal may be based at least in part comparing the signal to the first reference voltage, and comparing the signal to a second reference voltage, where modifying the signal may be based at least in part comparing the signal to the first reference voltage.

Some examples of the method 1000 and the apparatus described herein may further include operations, features, means, or instructions for sending a first feedback signal to the feedback circuit based on comparing the signal to the first reference voltage, and sending a second feedback signal to the feedback circuit based on comparing the signal to the second reference voltage, where modifying the signal input into the second circuit may be based on sending the first feedback signal and the second feedback signal.

Some examples of the method 1000 and the apparatus described herein may further include operations, features, means, or instructions for weighting the first feedback signal and the second feedback signal based on at least one feedback parameter, where modifying the signal may be based on weighting the first feedback signal and the second feedback signal.

Some examples of the method 1000 and the apparatus described herein may further include operations, features, means, or instructions for delaying the first feedback signal, where modifying the signal input into the second circuit may be based on delaying the first feedback signal.

Some examples of the method 1000 and the apparatus described herein may further include operations, features, means, or instructions for receiving, by a decoder, the first feedback signal and the second feedback signal, and determining a symbol of the signal transmitted during the first sampling event based on receiving the first feedback signal and the second feedback signal.

Some examples of the method 1000 and the apparatus described herein may further include operations, features, means, or instructions for receiving a single-ended signal over a channel coupled with a host device and a memory device, and outputting a differential signal based on receiving the single-ended signal, where the signal includes the differential signal.

Figure 11:
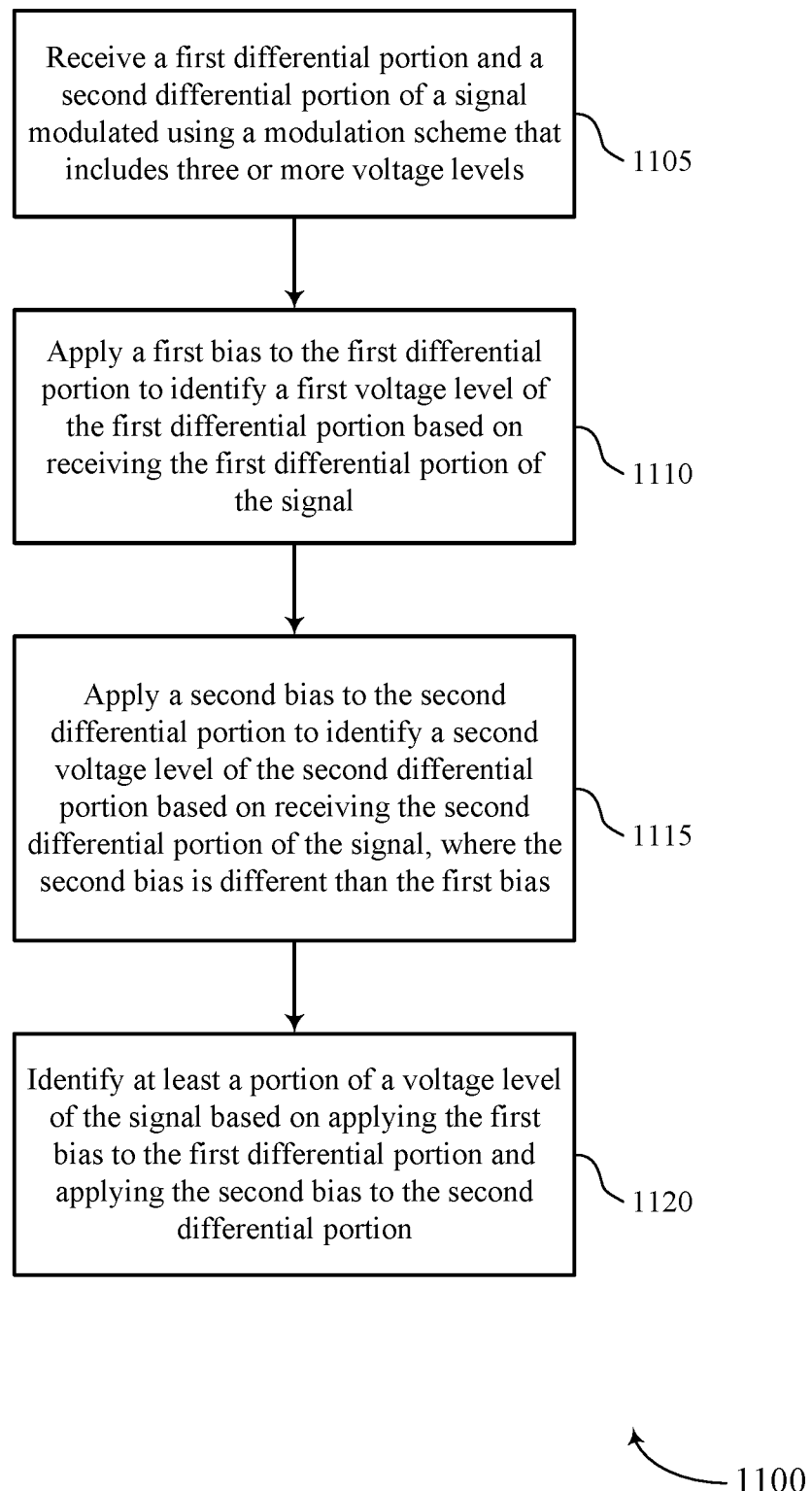

FIG. 11 shows a flowchart illustrating a method or methods 1100 that supports feedback for multi-level signaling in a memory device in accordance with examples as disclosed herein. The operations of method 1100 may be implemented by a memory device or its components as described herein. For example, the operations of method 1100 may be performed by a memory device as described with reference to FIG. 9. In some examples, a memory device may execute a set of instructions to control the functional elements of the memory device to perform the described functions. Additionally or alternatively, a memory device may perform aspects of the described functions using special-purpose hardware.

At 1105, the memory device may receive a first differential portion and a second differential portion of a signal modulated using a modulation scheme that includes three or more voltage levels. The operations of 1105 may be performed according to the methods described herein. In some examples, aspects of the operations of 1105 may be performed by a signal receiver as described with reference to FIG. 9.

At 1110, the memory device may apply a first bias to the first differential portion to identify a first voltage level of the first differential portion based on receiving the first differential portion of the signal. The operations of 1110 may be performed according to the methods described herein. In some examples, aspects of the operations of 1110 may be performed by a biasing component as described with reference to FIG. 9.

At 1115, the memory device may apply a second bias to the second differential portion to identify a second voltage level of the second differential portion based on receiving the second differential portion of the signal, where the second bias is different than the first bias. The operations of 1115 may be performed according to the methods described herein. In some examples, aspects of the operations of 1115 may be performed by a biasing component as described with reference to FIG. 9.

At 1120, the memory device may identify at least a portion of a voltage level of the signal based on applying the first bias to the first differential portion and applying the second bias to the second differential portion. The operations of 1120 may be performed according to the methods described herein. In some examples, aspects of the operations of 1120 may be performed by a voltage level determination component as described with reference to FIG. 9.

In some examples, an apparatus as described herein may perform a method or methods, such as the method 1100. The apparatus may include features, means, or instructions (e.g., a non-transitory computer-readable medium storing instructions executable by a processor) for receiving a first differential portion and a second differential portion of a signal modulated using a modulation scheme that includes three or more voltage levels, applying a first bias to the first differential portion to identify a first voltage level of the first differential portion based on receiving the first differential portion of the signal, applying a second bias to the second differential portion to identify a second voltage level of the second differential portion based on receiving the second differential portion of the signal, where the second bias is different than the first bias, and identifying at least a portion of a voltage level of the signal based on applying the first bias to the first differential portion and applying the second bias to the second differential portion.

Some examples of the method 1100 and the apparatus described herein may further include operations, features, means, or instructions for receiving a first control signal, where applying the first bias may be based on receiving the first control signal, and receiving a second control signal, where applying the second bias may be based on receiving the second control signal.

Some examples of the method 1100 and the apparatus described herein may further include operations, features, means, or instructions for comparing the first voltage level of the first differential portion of the signal to a first reference voltage based on applying the first bias, and comparing the second voltage level of the second differential portion of the signal to a second reference voltage based on applying the second bias.

Some examples of the method 1100 and the apparatus described herein may further include operations, features, means, or instructions for outputting the first differential portion of a feedback signal based on comparing the first differential portion of the signal to the first reference voltage, and outputting the second differential portion of the feedback signal based on comparing the second differential portion of the signal to the second reference voltage.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory device, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a first circuit configured to determine, for a first sampling event associated with a rising edge of a clock signal, a first voltage level of a signal modulated using a modulation scheme that includes three or more voltage levels;
a first feedback circuit coupled with an input of a second circuit and an output of the first circuit, the first feedback circuit configured to receive, from the first circuit, a feedback signal indicating information about the first voltage level of the first sampling event and modify the signal input into the second circuit based at least in part on the feedback signal; and
the second circuit configured to determine, for a second sampling event associated with a falling edge of the clock signal, a second voltage level of the signal based at least in part on the first feedback circuit modifying the signal.

2. The apparatus of claim 1, further comprising:
a second feedback circuit coupled with an input of the first circuit and an output of the second circuit, the second feedback circuit configured to receive, from the second circuit, a second feedback signal indicating information about the second voltage level of the second sampling event and modify the signal input into the first circuit based at least in part on the feedback signal.

3. The apparatus of claim 1, wherein the first circuit comprises a plurality of latch circuits each configured to compare the signal to a different reference voltage of a plurality of reference voltages.

4. The apparatus of claim 3, wherein each latch circuit of the plurality generates a different feedback signal based at least in part on comparing the signal to the different reference voltage, wherein the feedback signal comprises a plurality of feedback signals generated by the plurality of latch circuits.

5. The apparatus of claim 3, wherein the first circuit comprises a decoder configured to receive a plurality of different feedback signals from the plurality of latch circuits and determine a symbol associated with the signal based at least in part on the plurality of different feedback signals.

6. The apparatus of claim 5, wherein the decoder comprises a thermometer code decoder.

7. The apparatus of claim 3, wherein at least one of the plurality of latch circuits comprises a strongARM latch.

8. The apparatus of claim 1, wherein the first feedback circuit comprises a plurality of third circuits each configured to apply a different feedback signal of a plurality of feedback signals to the signal.

9. The apparatus of claim 8, wherein the first feedback circuit comprises one or more fourth circuits configured to delay the feedback signal at least one sampling event associated with the rising edge of the clock signal or the falling edge of the clock signal.

10. The apparatus of claim 1, further comprising:
an amplifier coupled with the first circuit and configured to receive a single-ended signal over a channel and output a differential signal based at least in part on receiving the single-ended signal, wherein the signal comprises the differential signal.

11. The apparatus of claim 1, wherein the signal and the feedback signal are differential signals.

12. The apparatus of claim 1, further comprising:
a differential amplifier coupled with an input of the first circuit and configured to receive a differential signal associated with the first voltage level of the signal.

13. The apparatus of claim 1, wherein the modulation scheme comprises a pulse amplitude modulation (PAM) scheme.

14. A method, comprising:
receiving a signal modulated using a modulation scheme that includes three or more voltage levels;
determining, by a first circuit during a first sampling event associated with a rising edge of a clock signal, a first voltage level of the signal;
modifying, by a feedback circuit, the signal sent to a second circuit during a second sampling event associated with a falling edge of the clock signal based at least in part on determining the first voltage level that occurs at the first sampling event; and
determining, by the second circuit during the second sampling event, a second voltage level of the signal based at least in part on modifying the signal being input into the second circuit.

15. The method of claim 14, further comprising:
comparing the signal to a first reference voltage, wherein modifying the signal is based at least in part comparing the signal to the first reference voltage; and
comparing the signal to a second reference voltage, wherein modifying the signal is based at least in part comparing the signal to the first reference voltage.

16. The method of claim 15, further comprising:
sending a first feedback signal to the feedback circuit based at least in part on comparing the signal to the first reference voltage; and
sending a second feedback signal to the feedback circuit based at least in part on comparing the signal to the second reference voltage, wherein modifying the signal input into the second circuit is based at least in part on sending the first feedback signal and the second feedback signal.

17. The method of claim 16, further comprising:
weighting the first feedback signal and the second feedback signal based at least in part on at least one feedback parameter, wherein modifying the signal is based at least in part on weighting the first feedback signal and the second feedback signal.

18. The method of claim 16, further comprising:
delaying the first feedback signal, wherein modifying the signal input into the second circuit is based at least in part on delaying the first feedback signal.

19. The method of claim 16, further comprising:
receiving, by a decoder, the first feedback signal and the second feedback signal; and
determining a symbol of the signal transmitted during the first sampling event based at least in part on receiving the first feedback signal and the second feedback signal.

20. The method of claim 14, further comprising:
receiving a single-ended signal over a channel coupled with a host device and a memory device; and
outputting a differential signal based at least in part on receiving the single-ended signal, wherein the signal comprises the differential signal.

21. An apparatus, comprising:
a latch configured to compare a voltage level of a signal modulated using a modulation scheme that includes three or more voltage levels to a reference voltage, the latch comprising a first input circuit and a second input circuit,
the first input circuit comprising:
a first switching component configured to receive a first differential portion of the signal; and
a second switching component coupled with the first switching component and configured to receive a first control signal that tunes the latch; and
the second input circuit comprising:
a third switching component configured to receive a second differential portion of the signal; and
a fourth switching component coupled with the second switching component and configured to receive a second control signal that tunes the latch different than the first control signal.

22. The apparatus of claim 21, further comprising:
a second latch configured to compare the voltage level of the signal to a second reference voltage, the second latch comprising a third input circuit and a fourth input circuit; and
a third latch configured to compare the voltage level of the signal to a third reference voltage, the third latch comprising a fifth input circuit and a sixth input circuit.

23. The apparatus of claim 21, wherein the first switching component is configured to receive the first differential portion of the signal at a gate, the second switching component is configured to receive the first control signal at a gate, the third switching component is configured to receive the second differential portion of the signal at a gate, and the fourth switching component is configured to receive the second control signal at a gate.

24. The apparatus of claim 21, wherein the first control signal is different than the second control signal based at least in part on a difference between the first differential portion of the signal and the second differential portion of the signal and the reference voltage.

25. The apparatus of claim 21, wherein the modulation scheme comprises a pulse amplitude modulation (PAM) scheme.

26. The apparatus of claim 21, wherein the latch comprises a strongARM latch having a differential input and a differential output.

27. The apparatus of claim 21, wherein the latch is configured to output a differential signal to determine a symbol associated with the signal.

28. A method, comprising:
receiving a first differential portion and a second differential portion of a signal modulated using a modulation scheme that includes three or more voltage levels;
applying a first bias to the first differential portion to identify a first voltage level of the first differential portion based at least in part on receiving the first differential portion of the signal;
applying a second bias to the second differential portion to identify a second voltage level of the second differential portion based at least in part on receiving the second differential portion of the signal, wherein the second bias is different than the first bias; and
identifying at least a portion of a voltage level of the signal based at least in part on applying the first bias to the first differential portion and applying the second bias to the second differential portion.

29. The method of claim 28, further comprising:
receiving a first control signal, wherein applying the first bias is based at least in part on receiving the first control signal; and
receiving a second control signal, wherein applying the second bias is based at least in part on receiving the second control signal.

30. The method of claim 28, further comprising:
comparing the first voltage level of the first differential portion of the signal to a first reference voltage based at least in part on applying the first bias; and
comparing the second voltage level of the second differential portion of the signal to a second reference voltage based at least in part on applying the second bias.

31. The method of claim 30, further comprising:
outputting the first differential portion of a feedback signal based at least in part on comparing the first differential portion of the signal to the first reference voltage; and
outputting the second differential portion of the feedback signal based at least in part on comparing the second differential portion of the signal to the second reference voltage.

32. An apparatus, comprising:
a first circuit configured to determine, for a first sampling event associated with a rising edge of a clock signal, a first voltage level of a signal modulated using a modulation scheme that includes three or more voltage levels;
a first feedback circuit coupled with an output of the first circuit and comprising one or more delay circuits, the first feedback circuit configured to modify the signal input into a second circuit for a plurality of sampling events associated with the clock signal that occur after the first sampling event based at least in part on the first voltage level; and
the second circuit configured to determine, for a second sampling event associated with a falling edge of the clock signal of the plurality of sampling events, a second voltage level of the signal based at least in part on the first feedback circuit modifying the signal.

33. The apparatus of claim 32, further comprising:
a second feedback circuit coupled with an input of the first circuit and an output of the second circuit and comprising one or more third circuits configured to delay a first feedback signal output by the first feedback circuit at least one sampling event associated with the clock signal, the second feedback circuit configured receive a second feedback signal from the second circuit and modify the signal input into the first circuit for a plurality of sampling events associated with the clock signal that occur after the second sampling event based at least in part on the second voltage level.

34. The apparatus of claim 32, further comprising:
a third feedback circuit coupled with an input of the first circuit and the output of the first circuit and comprising one or more third circuits configured to delay a feedback signal output by the first feedback circuit at least one sampling event associated with the clock signal, the third feedback circuit configured receive the feedback signal from the first circuit and modify the signal input into the first circuit for a plurality of sampling events associated with the clock signal that occur after the first sampling event based at least in part on the first voltage level.

* * * * *